(12) United States Patent
Kawahara et al.

(10) Patent No.: US 8,837,251 B2
(45) Date of Patent: Sep. 16, 2014

(54) SEMICONDUCTOR DEVICE WITH LOW VOLTAGE PROGRAMMING/ERASING OPERATION

(75) Inventors: Takayuki Kawahara, Higashiyamato (JP); Riichiro Takemura, Tokyo (JP); Kazuo Ono, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 398 days.

(21) Appl. No.: 13/122,732

(22) PCT Filed: Oct. 5, 2009

(86) PCT No.: PCT/JP2009/067354
§ 371 (c)(1),
(2), (4) Date: Apr. 5, 2011

(87) PCT Pub. No.: WO2010/041632
PCT Pub. Date: Apr. 15, 2010

(65) Prior Publication Data
US 2011/0194361 A1    Aug. 11, 2011

(30) Foreign Application Priority Data

Oct. 6, 2008 (JP) ................................. 2008-259206

(51) Int. Cl.
*G11C 8/00* (2006.01)
*G11C 11/16* (2006.01)
*G11C 11/4094* (2006.01)
*G11C 11/4097* (2006.01)
*G11C 7/12* (2006.01)
*G11C 7/18* (2006.01)

(52) U.S. Cl.
CPC ............ *G11C 11/1655* (2013.01); *G11C 11/16* (2013.01); *G11C 11/4094* (2013.01); *G11C 11/4097* (2013.01); *G11C 7/12* (2013.01); *G11C 7/18* (2013.01)

USPC ............ 365/230.06; 365/189.09; 365/189.11; 365/230.03; 365/148; 365/158

(58) Field of Classification Search
None
See application file for complete search history.

(56) References Cited

U.S. PATENT DOCUMENTS

| 6,587,371 B1 | 7/2003 | Hidaka |
| 6,680,862 B2 | 1/2004 | Hidaka |

(Continued)

FOREIGN PATENT DOCUMENTS

| CN | 1362709 A | 8/2002 |
| CN | 1402254 A | 3/2003 |

(Continued)

OTHER PUBLICATIONS

Hosomi et al., "A Novel Nonvolatile Memory with Spin Torque Transfer Magnetization Switching: Spin-RAM", 2005 International Electron Device Meeting, Technical Digest papers, pp. 459-462.

(Continued)

*Primary Examiner* — Kretelia Graham
(74) *Attorney, Agent, or Firm* — Miles & Stockbridge P.C.

(57) ABSTRACT

An array configuration capable of supplying a necessary and sufficient current in a small area is achieved and a reference cell configuration suitable to temperature characteristics of a TMR element is achieved. In a memory using inversion of spin transfer switching, a plurality of program drivers are arranged separately along one global bit line, and one sense amplifier is provided to one global bit line. A reference cell to which "1" and "0" are programmed is shared by two arrays and a sense amplifier.

10 Claims, 26 Drawing Sheets

(56) References Cited

U.S. PATENT DOCUMENTS

| | | |
|---|---|---|
| 6,930,927 B2 * | 8/2005 | Pascucci .................. 365/185.29 |
| 6,954,374 B2 | 10/2005 | Hidaka |
| 6,999,341 B2 * | 2/2006 | Ooishi .......................... 365/171 |
| 7,126,843 B2 | 10/2006 | Higashi |
| 7,251,184 B2 * | 7/2007 | Nakaya et al. ........... 365/230.03 |
| 7,376,005 B2 | 5/2008 | Hidaka |
| 7,379,345 B2 * | 5/2008 | Omoto ..................... 365/185.25 |
| 7,643,344 B2 | 1/2010 | Choi |
| 7,821,819 B2 * | 10/2010 | Hachino ...................... 365/158 |
| 8,004,925 B2 | 8/2011 | Choi |
| 8,014,211 B2 * | 9/2011 | Hess et al. ............... 365/189.02 |
| 8,040,719 B2 * | 10/2011 | Cho et al. ..................... 365/163 |
| 2002/0080644 A1 | 6/2002 | Ito |
| 2003/0026125 A1 | 2/2003 | Hidaka |
| 2004/0001358 A1 * | 1/2004 | Nahas et al. ............. 365/185.18 |
| 2004/0125650 A1 | 7/2004 | Tsuji |
| 2004/0252552 A1 * | 12/2004 | Tanzawa et al. ............. 365/158 |
| 2005/0117392 A1 | 6/2005 | Hayakawa et al. |
| 2006/0044794 A1 | 3/2006 | Hatsuda et al. |
| 2007/0263423 A1 * | 11/2007 | Scheuerlein et al. .... 365/185.25 |
| 2009/0180306 A1 * | 7/2009 | Terada et al. ................... 365/72 |
| 2011/0044092 A1 * | 2/2011 | Ono et al. ..................... 365/148 |
| 2012/0092921 A1 * | 4/2012 | Ono et al. ..................... 365/148 |

FOREIGN PATENT DOCUMENTS

| | | |
|---|---|---|
| JP | 2002-197853 A | 7/2002 |
| JP | 2002-260378 A | 9/2002 |
| JP | 2003-15188 A | 4/2003 |
| JP | 2003-242771 A | 8/2003 |
| JP | 2004-206788 A | 7/2004 |
| JP | 2005-116923 A | 4/2005 |
| JP | 2006-065901 A | 3/2006 |
| JP | 2008-147437 A | 6/2008 |
| KR | 10 2008 0025841 | 3/2008 |

OTHER PUBLICATIONS

Office Action issued Sep. 25, 2012, in Japanese Patent Application. No. 2010-532908.

English language translation of Office Action issued in Korean Application No. 10-2011-707936.

* cited by examiner

Parallel

Anti-parallel

Parallel

Anti-parallel

Parallel

Anti-parallel

P → AP

AP → P

SEMICONDUCTOR DEVICE WITH LOW VOLTAGE PROGRAMMING/ERASING OPERATION

TECHNICAL FIELD

The present invention relates to a semiconductor device and more particularly relates to a method of achieving necessary and sufficient programming/erasing current from a small area in a memory cell array using changes in magnetoresistance, and a configuration and operation of a reference cell which is stable in read in consideration of temperature characteristics.

BACKGROUND ART

Among non-volatile memories, MRAM (Magnetoresistive Random Access Memory) using changes in magnetoresistance is a possible RAM capable of high-speed operation and programmable/erasable for unlimited programming/erasing cycles in practice. An existing cell configuration of MRAM includes one magnetic tunnel junction element TMR, a select transistor MCT for read, a program word line WWL, a bit line BL, and a source line SL. As illustrated in FIG. 34, the magnetic tunnel junction element TMR has at least two magnetic layers, one of them being a fixed layer PL having a fixed spin direction and the other being a free layer FL having two states of spin directions of a parallel direction to the fixed layer and an anti-parallel direction to the fixed layer. A tunnel barrier film TB is provided between these layers. Storage of information is achieved by a direction of spin of the free layer, and an electric resistance of the magnetic tunnel junction element TMR is in a high-resistance state in the anti-parallel state and is in a low-resistance state in the parallel state. In a read operation, magnitude of a resistance of the magnetic tunnel junction element TMR is read. Meanwhile, in a programming/erasing operation, current is flowed in the program word line WWL and the bit line BL and directions of spin of the free layer is controlled by a resultant induced magnetic field in the magnetic tunnel junction element TMR upon flowing the current. However, in this programming/erasing method, since the size of the magnetic field necessary for programming/erasing is increased as the magnetic tunnel junction element TMR is miniaturized, there is a problem of an increase in current to be flowed in the program word line and bit line. Regarding this problem, there is a spin-injection RAM or SPRAM (Spin-Transfer Torque RAM) utilizing the spin-injection magnetization inversion technology changing directions of spin in the free layer by perpendicularly flowing current in the magnetic tunnel junction element TMR as introduced by Non-Patent Document 1 (2005 International Electron Device Meeting, Technical Digest Papers, pp. 459-462). As illustrated in FIG. 35, this programming/erasing method can control directions of spin in a free layer by current in a direction perpendicular to the fixed layer PL, the tunnel barrier film TB, and the free layer FL. In a memory chip, a bit line and a source line are provided, a select transistor and a magnetic tunnel junction element TMR are arranged between the bit line and the source line, and current is flowed from the bit line to the source line or from the source line to the bit line to perform programming and erasing. As the current required for programming/erasing is proportional to magnitude of the magnetic tunnel junction element TMR, the programming/erasing current can be reduced along with miniaturization of the magnetic tunnel junction element TMR, and it is excellent in scalability. As the tunnel barrier film TB, MgO is used.

PRIOR ART DOCUMENT

Patent Document

Patent Document 1: Japanese Patent Application Laid-Open Publication No. 2005-116923

Non-Patent Document

Non-Patent Document 1: 2005 International Electron Device Meeting Technical Digest Papers pp. 459-462

DISCLOSURE OF THE INVENTION

Problems to be Solved by the Invention

However, in the spin-transfer torque RAM, its programming/erasing current, that is, current necessary for inverting the directions of magnetization corresponding to information is necessary to be about tens of micro amperes to 500 micro amperes. Thus, a mechanism capable of efficiently applying the current to a memory cell is desired. More specifically, the mechanism includes a driving circuit which applies to a memory cell, an arrangement of a bit line and a source line to be paths for current connecting the driving circuit and the memory cell, and a method of controlling the same. Particularly, as the bit line and the source line have a resistance component, a voltage lowering occurs when flowing a current in the bit line and source line. A method simple and having high area efficiency with suppressing the voltage lowering is desired.

In addition, from the knowledge of the inventors of the present invention, as described later, the temperature dependency of respective resistors in parallel state and anti-parallel state differs.

Means for Solving the Problems

Typical means provided in the present invention are as follows.

(1) A bit line and a source line have a hierarchical structure, a driver for programming/erasing is arranged per a lower bit line and source line, and a sense amplifier for read is arranged per an upper bit line and source line. More specifically, to explain by the bit line, a plurality of the lower bit lines and the programming/erasing drivers (circuits) are separately arranged in a direction of wiring the upper bit line, and the single sense amplifier is provided to the single upper bit line. Also, the driver of the bit line and the driver of the source line can be arranged across an array.

(2) While two cells in a parallel state and an anti-parallel state corresponding to stored information of "1" and "0" are used and as a reference cell with current of the two cells, while an array having a sense amplifier including a reference cell in a parallel state and another array having a sense amplifier including a reference cell in an anti-parallel state create a state in-between "1" and "0" by connecting current path of the arrays.

Effects of the Invention

The semiconductor device capable of stable operation can be achieved.

BRIEF DESCRIPTIONS OF THE DRAWINGS

FIG. 28(2) is a circuit diagram corresponding to the memory cell in the cross-sectional structure of FIG. 27;

BEST MODE FOR CARRYING OUT THE INVENTION

Figure 1:
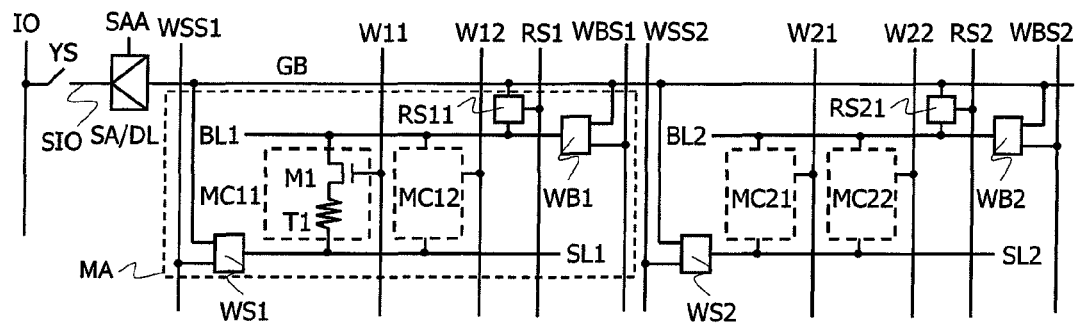
FIG. 1 is a diagram illustrating a first embodiment of the present invention.

A first embodiment of the present invention will be described with reference to FIG. 1. In FIG. 1, MA denotes a memory array, MC11, MC12, MC21 and MC 22 denote memory cells, each of the memory cells being formed of a select transistor M1 and a TMR element T1 as illustrated in MC11. The memory cells are connected to a local bit line and a local source line as a memory array of MC11 and MC12 and a memory array of MC21 and MC22 in FIG. 1. Note that a memory array MA is described as one memory array as a representative memory array. An upper bit line (global bit line) is denoted by GB, and a plurality of lower bit lines (local bit lines) BL1 and BL2 and source lines (local source lines) SL1 and SL2 are provided. A programming/erasing driver is provided to the bit lines and source lines, respectively. More specifically, a bit line driver WB1 and a source line driver WS1 are provided to BL1 and SL1, and WB2 and WS2 are provided to BL2 and SL2 in the same manner. One of inputs of each of the drivers is connected to GB, and the other is connected to select signal lines WBS1, WSS1, WBS2 and WSS2. Here, the bit line driver and the source line driver are arranged at the opposite side across an array configured by each of the local bit lines and local source line and the memory cell. The bit line drivers WB1 and WB2 has an output at a potential corresponding to a potential of the global bit line upon programming, and the output is at high impedance upon read. In addition, the source line drivers WS1 and WS2 has an output at a potential corresponding to a potential of the global bit line, and the output is at a ground potential upon read. Also, for reading, select switches RS11 and RS21 which selectively connect the global bit line and local bit line are arranged, and select signals of the select switches are RS1 and RS2. The select switches RS11 and RS21 are arranged on the same side as the bit line drivers WB1 and WB2 (in other words, opposite to the source line drivers WS1 and WS2). A sense amplifier/programming/erasing latch SA/DL which works as both a sense amplifier and a data latch for programming/erasing is connected to GB, and having activation signal SAA and an input/output terminal SIO. Results of operations of the sense amplifier or data for programming/erasing are exchanged by connecting to an IO line IO and a switch controlled by a Y select signal YS. According to the present embodiment, the local bit line and the local source line are arranged per a small amount of memory cells, and thus necessary and sufficient programming/erasing current can be supplied to the memory cell. That is, parasitic capacitance of the local bit line and local source line is small and power is thus small, and also, parasitic resistance of the local bit line and local source line is small and voltage lowering is thus small; therefore, programming/erasing at a low voltage is possible. In addition, the bit line driver and the source line driver are arranged at the opposite side across a rectangular area in which a memory cell is formed, and thus current paths between the bit line driver and source line driver are equal and the dependency to memory cell position can be further lowered. Operations will be described later.

Figure 2:
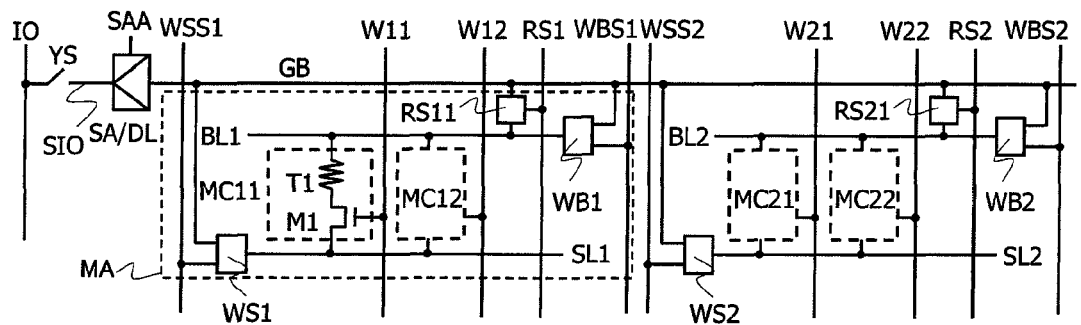
FIG. 2 is a diagram illustrating a second embodiment of the present invention.

FIG. 2 is a second embodiment of the present invention. Differences from FIG. 1 are in the memory cell portion. In the second embodiment, the select transistor M1 is connected to the local source line SL1. In the other memory cells, the local source line and the select transistor are connected in the same manner. By selecting a wiring layer of the local source line and the local bit line, more suitable configuration can be selected from FIGS. 1 and 2. For example, FIG. 1 is better for a wiring layer having the bit line using a low-resistance material, and FIG. 2 is better for a wiring layer having the source line using a low-resistance material.

Figure 3:
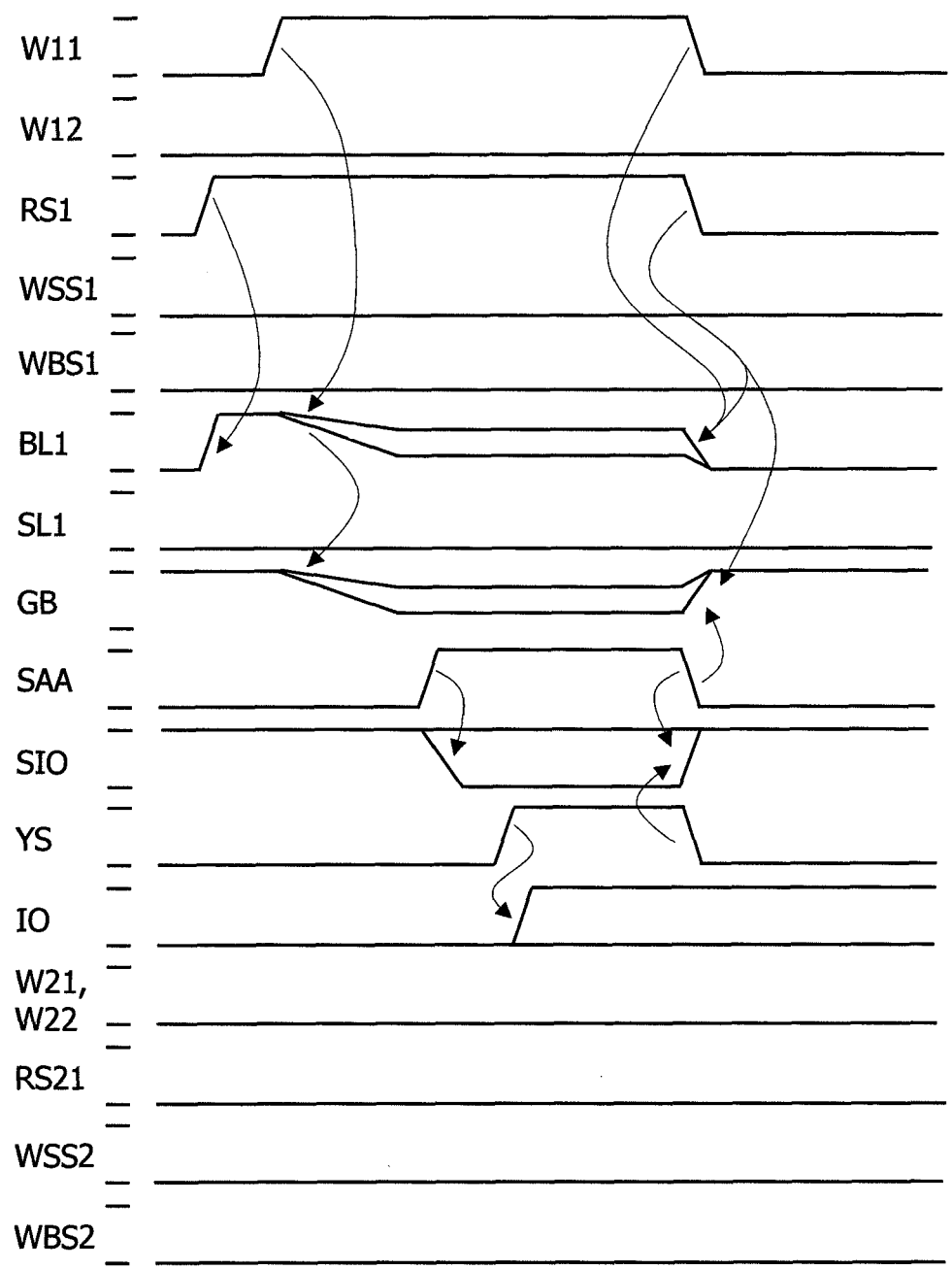
FIG. 3 is a diagram illustrating an example of read operation of a configuration example in FIG. 1.

FIG. 3 is a diagram illustrating an operation example upon read of the circuit in FIG. 1. A situation in which the memory cell MC11 connected to the local bit line BL1 and the local source line SL1 is selected will be described. First, the local bit line BL1 is selected by RS1 based on a part of upper addresses in an X direction (part of upper addresses used in selecting a word line), so that BL1 is precharged. SL1 is grounded by the source line driver WS1. This precharge may be performed via GB or performed in a circuit embedded in RS11. Next, a word line W11 is activated and the memory cell MC11 is selected. A word line W12 representing other memory cells is remain unselected. In this manner, a signal corresponding to information of a memory cell selected by the bit line BL1 appears. This signal is transmitted to GB. In FIG. 3, BL1 and GB are connected by a switch and GB and BL1 are a same signal, while there is another way of receiving BL1 by a gate of a MOS transistor and generating an inverted signal of BL1 at GB. When a sufficient signal appears, SAA is selected so that SA/DL is operated as a sense amplifier, and an amplified signal appears on SIO. In the sense amplifier, a voltage or current signal for reference necessary for discriminating two states of the memory cell is provided using a reference cell or an equivalent resistance element described later, and information of the memory cell can be discriminated by using the voltage or current signal. Then, the Y select signal YS is activated and a signal corresponding to IP is outputted. When a sequence of operation is ended, W11, RS1, SAA are back to unselected state again, and BL1, GB, SIO are also back to their initial states. YS is also becomes unselected state, and IO remains the same or be back to a constant potential by a following circuit while it is not illustrated in FIG. 3. In this manner, a read operation can be carried out by using the circuit of FIG. 1.

Figure 4:
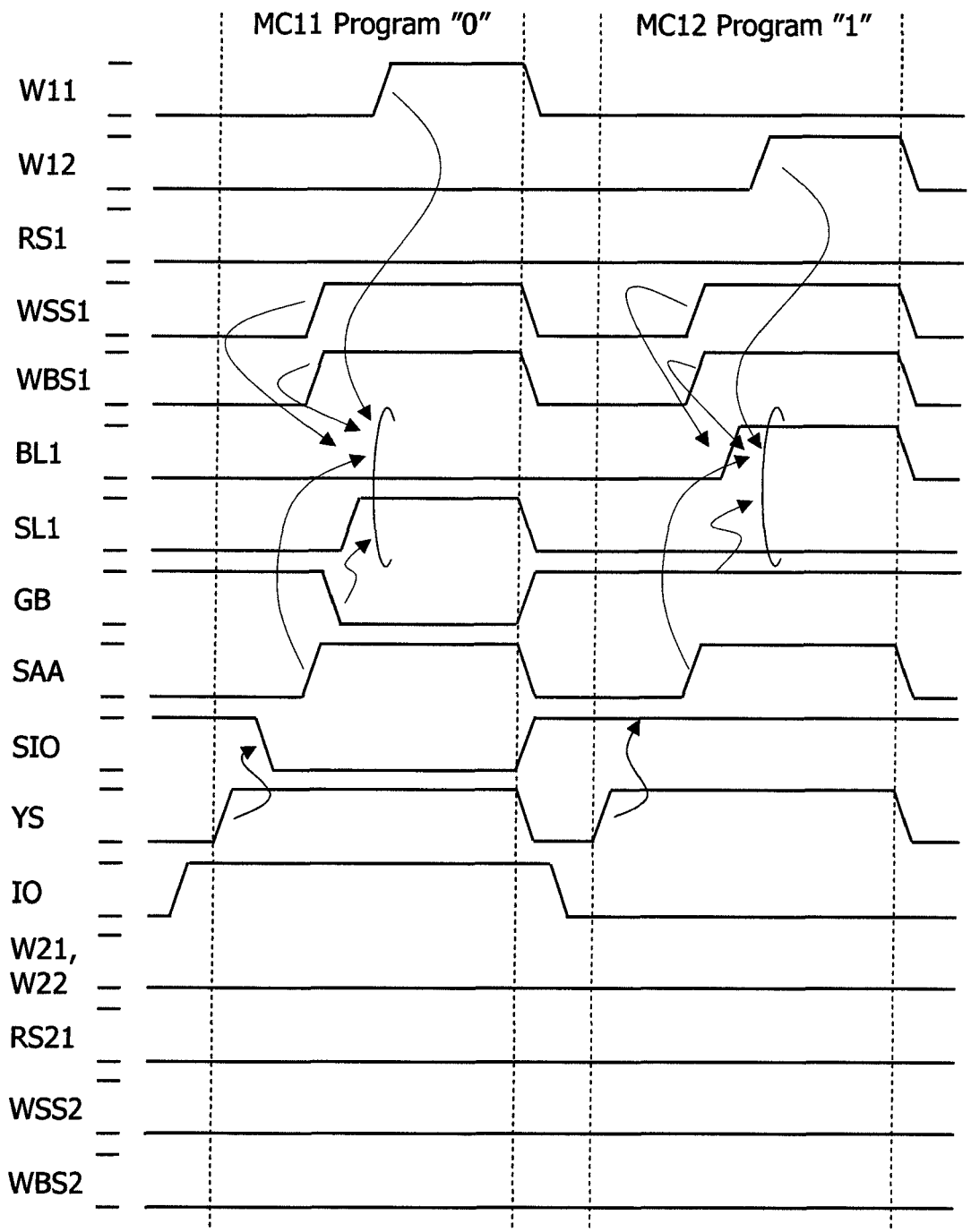
FIG. 4 is a diagram illustrating an example of programming operation of the configuration example in FIG. 1.

FIG. 4 is a diagram illustrating an operation example upon programming of the circuit in FIG. 1. Here, an operation in which "0" is first programmed in the MC11, and next "1" is programmed in MC12 will be described. First, YS is selected; data of IO at this moment is retrieved into SIO; SA/DL is activated by SAA; and a signal corresponding to information to be programmed to the memory cell appears on GB. Here, WSS1 and WBS1 are selected based on a part of upper addresses in the X direction (part of upper addresses used for selecting a word line), and, when WB1 and WS1 are activated, information to be programmed to the memory cell following a potential of GB appears on BL1 and SL1. In FIG. 4, GB is at a low level corresponding to "0", and accordingly, BL1 is at a low level and SL1 is at a high level. Note that, in this situation, WSS2 and WBS2 are in an unselected state, and WS2 and WB2 are inactivated. When W11 is selected in this state, programming to MC11 is started. Current is flowed from SL1 to BL1 via MC11. By this current, spin injection, which corresponds to a direction of the current, is performed inside the memory cell, thereby programming/erasing the memory cell to a corresponding state. When it ends, W11, WSS1, and WBS1 are in an unselected state, and supplement of current to the memory cell is stopped. Next, the operation is shifted to a programming operation of "1" to MC12. Here, the operation is the same as that YS is selected and data of IO is retrieved to SIO and SA/DL is activated by SAA, but a potential corresponding to programming of "1" appears on GB. Here, when WSS1 and WBS1 are selected based on a part of upper addresses in the X direction (part of upper addresses used for selecting a word line), BL1 is at a high level and SL1 is at a low level. When W12 is selected in this state, programming to MC12 is started. Current of this programming is in an opposite direction to the programming to MC11. Spin injection corresponding to the direction of the current is performed inside the memory cell, thereby programming/erasing the memory cell to a corresponding state. As described in the foregoing, by using the circuit of FIG. 1, programming/erasing of memory cell can be performed. Operation of the circuit in FIG. 2 is in the same manner.

Figure 5:
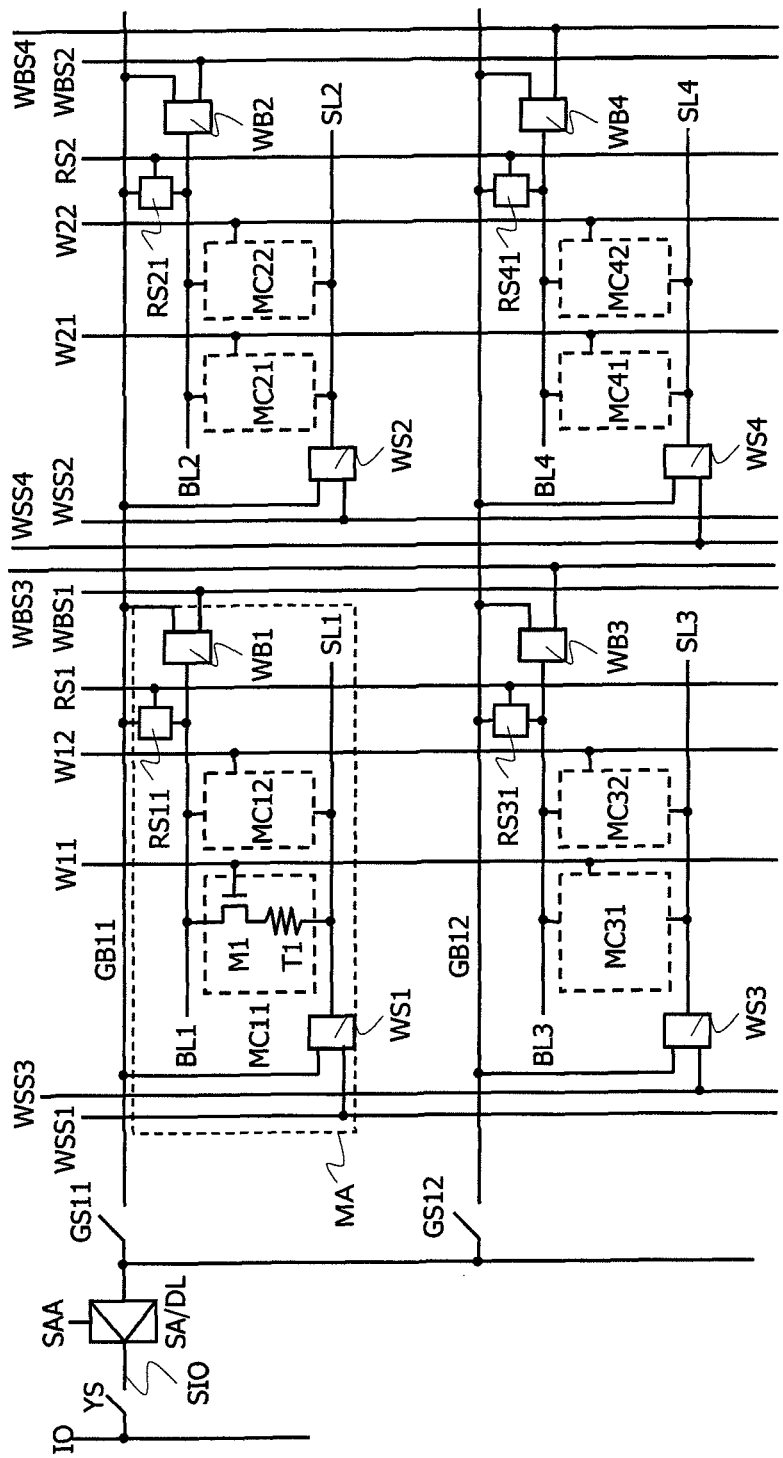
FIG. 5 is a diagram illustrating a third embodiment of the present invention.

FIG. 5 is a diagram illustrating a third embodiment of the present invention. A difference from FIGS. 1 and 2 is that a plurality of global bit lines GB11 and GB12 are provided to one sense amplifier. Thus, switches GS11 and GS12 which control input of the sense amplifier and connections of the global bit lines GB11 and GB12 are provided. In this manner, by making an array configuration in which one sense amplifier bundles a plurality of global bit lines together, a pitch of arranging the sense amplifiers is mitigated, and thus the layout becomes easier. Note that, although not illustrated, one of GS11 and GS12 is selected using a part of (or the whole of) addresses in a column direction, and information is transmitted to the input of the sense amplifier. Note that, in the third embodiment, it is needless to say that combinations of other embodiments described later are used in addition to the combination of the first and second embodiments.

Figure 6:
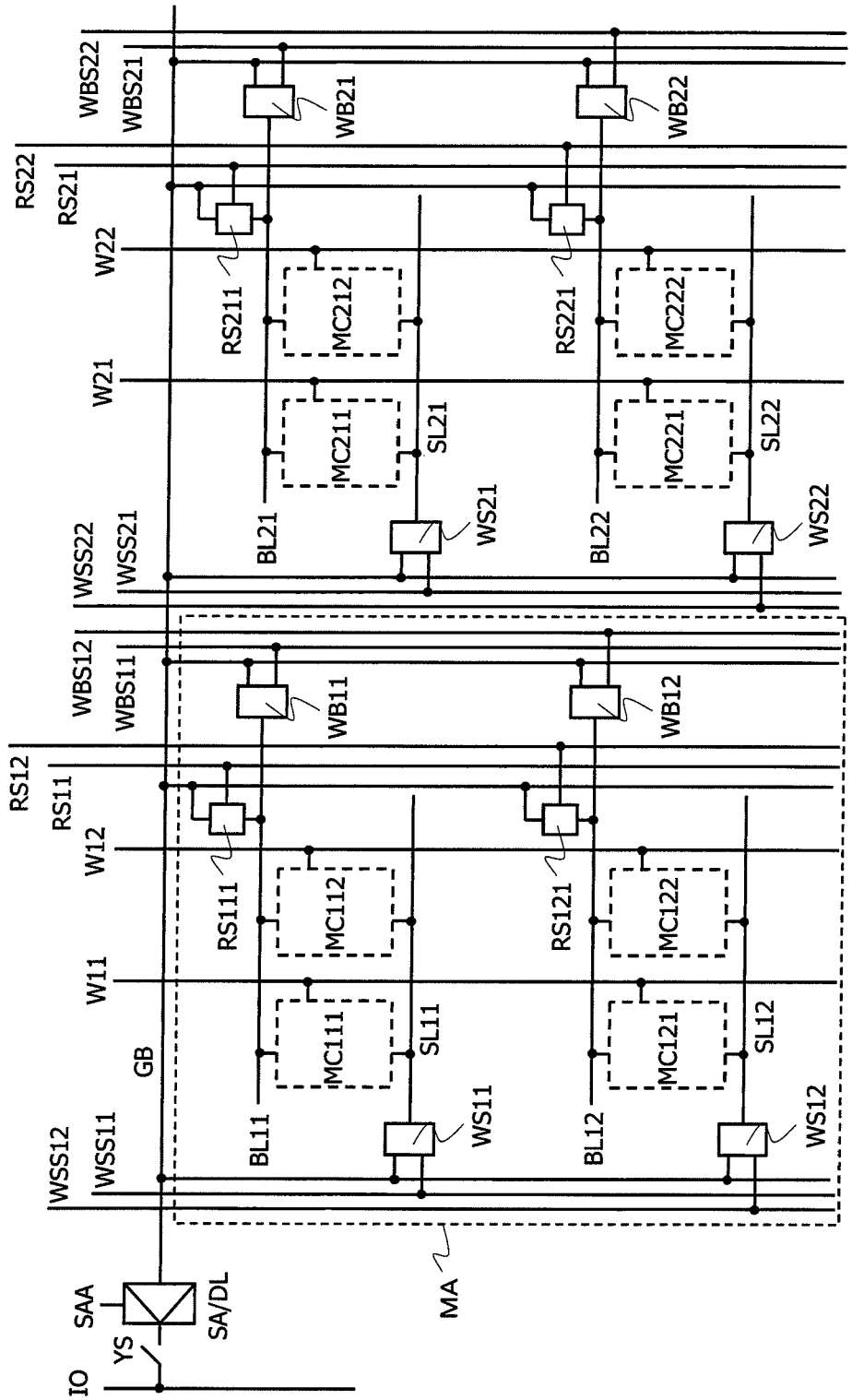
FIG. 6 is a diagram illustrating a fourth embodiment of the present invention.

FIG. 6 is a diagram illustrating a fourth embodiment of the present invention. Differences from FIG. 1 or 2 will be described. In the fourth embodiment, a plurality of local bit lines and local source lines are also arranged in a direction perpendicular to GB. Thus, to select a programming/erasing driver corresponding to these local bit lines and local source lines, the plurality of select signal lines WBS11 to WBS22 and WSS11 to WSS22 are provided. The same goes to read, and selected signal lines RS11 to RS22 are also provided in the perpendicular direction to GB to select a plurality of local bit lines and local source lines. In this manner, for example, local bit lines and local source lines BL11 and SL11 and BL12 and SL12 are arranged in the perpendicular direction to GB, and the programming/erasing drivers WB11 and WS11 of the BL11 and SL11 are selected by WBS11 and WSS11, and the programming/erasing drivers WB12 and WS12 of the BL12 and SL12 are selected by WBS12 and WSS12. Also in the read, BL11 is connected to GB at RS11 via RS111 and BL12 is connected to GB at RS12 via RS121. By configuring in this manner, one GB can be shared by a plurality of local bit lines and local source lines arranged next to each other in a perpendicular direction to GB. In this manner, there is a feature in enabling an easy layout as a pitch of GB wirings is mitigated. In this case, RS, WBS and WSS are selected using a part of addresses in the Y direction in addition to a part of addresses in the X direction.

Figure 7:
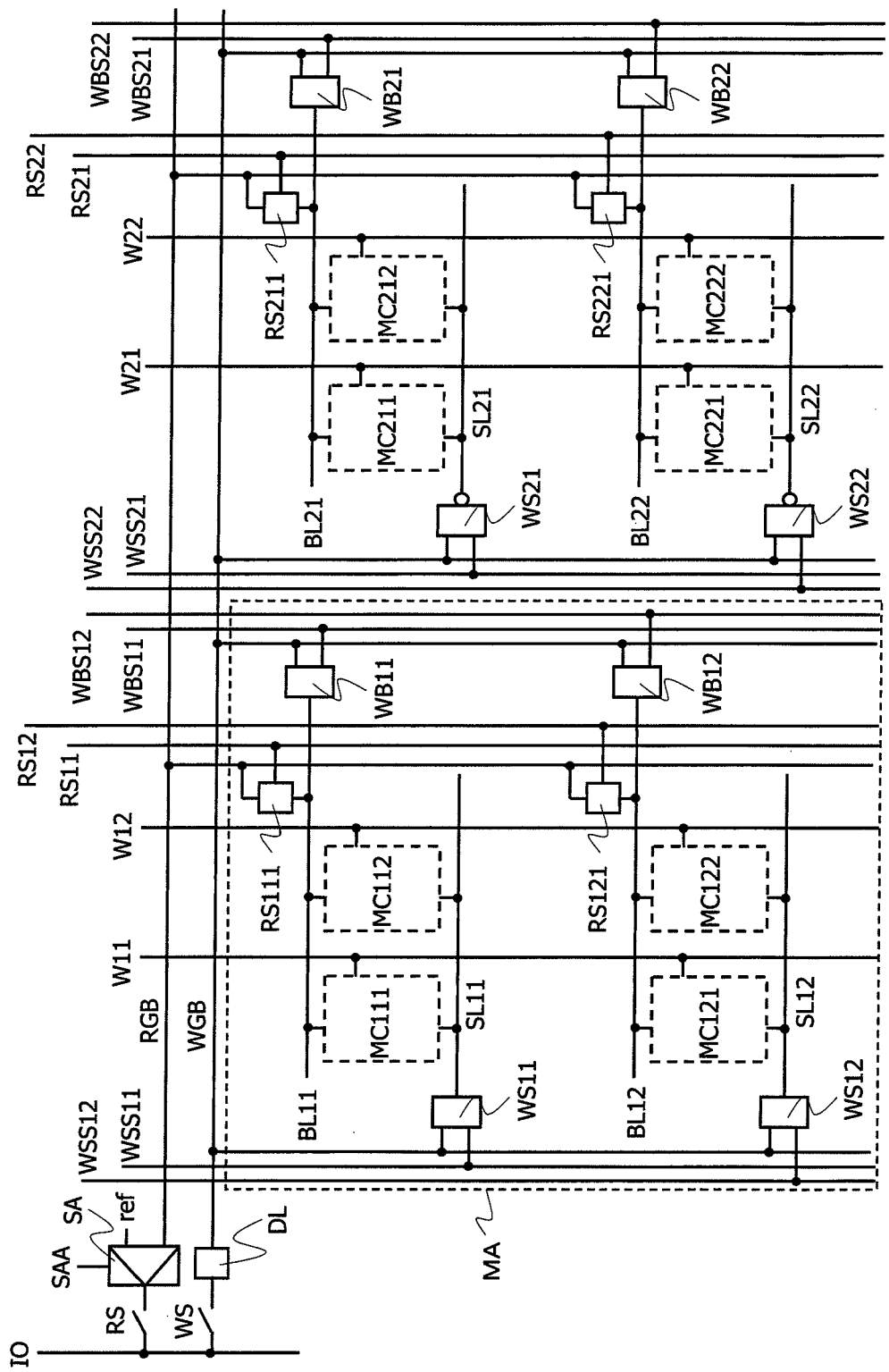
FIG. 7 is a diagram illustrating a fifth embodiment of the present invention.

FIG. 7 is a diagram illustrating a fifth embodiment of the present invention. A difference from FIG. 6 is that two lines of a global bit line for read RGB and a global bit line for programming/erasing WGB are provided in FIG. 7 to the global bit line GB in FIG. 6. Corresponding to this, a sense amplifier SA is disposed to the global bit line for read RGB, and DL which is a latch of programming/erasing signal is disposed to the global bit line for programming/erasing WGB. As to the sense amplifier SA, a reference signal ref upon read is also illustrated. SAA is an activating signal of the sense amplifier SA, and a result of it is transmitted to the IO line IO by a switch driven by RS. Also, DL and the IO line are connected to a switch driven by WS. By using the fifth embodiment, there is a feature in enabling a reduction of load on each of the global bit lines RGB and WGB, and high-speed enabling programming/erasing and highly-sensitive read. More specifically, for example, as a programming/erasing driver is not connected to the global bit line RGB for read, there is no parasitic capacitance here. Also, as RGB and WGB are shared by a plurality of local bit lines and local source lines arranged next to each other in a perpendicular direction to RGB and WGB, the pitch is mitigated, thereby enabling an easy layout.

Figure 8:
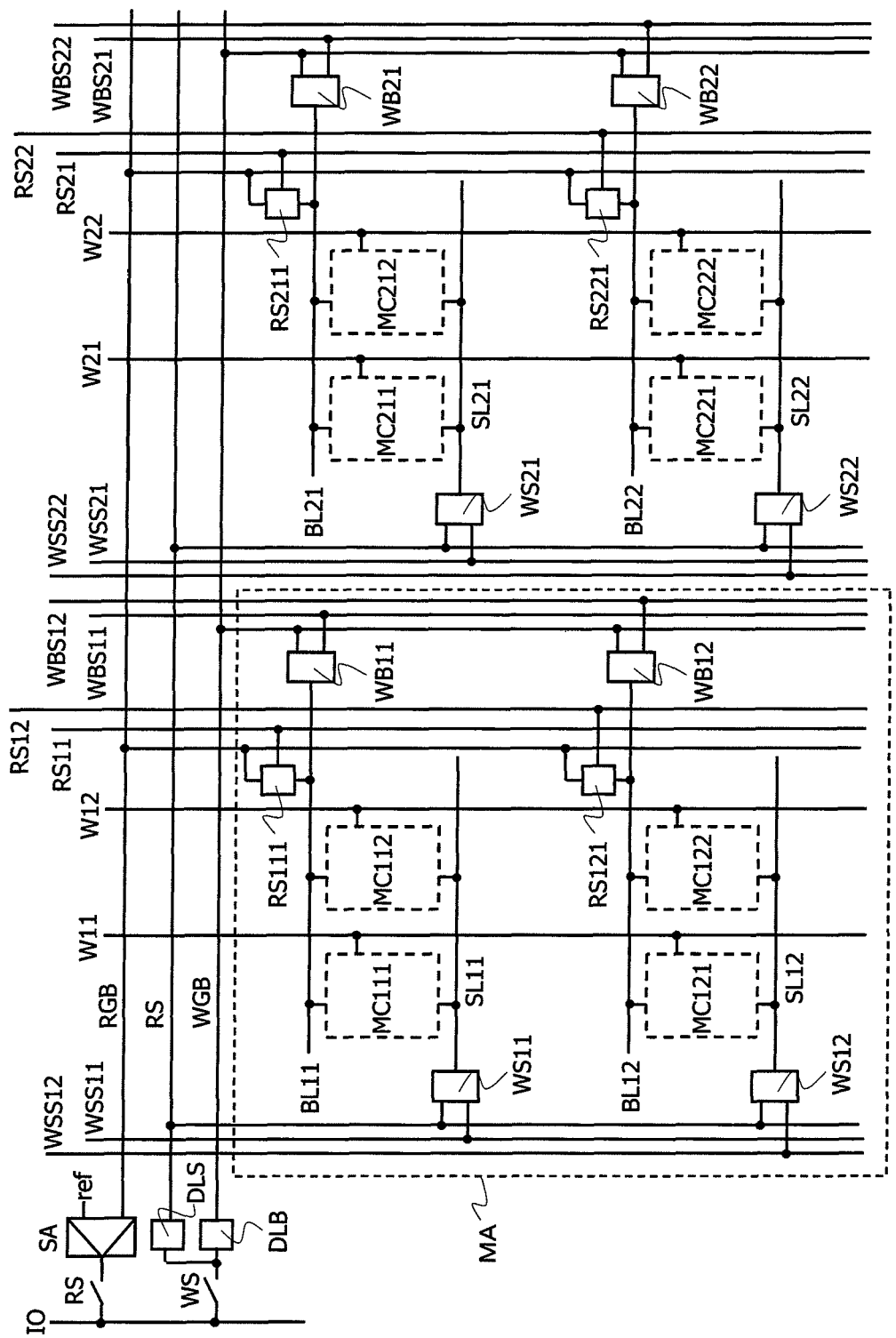
FIG. 8 is a diagram illustrating a sixth embodiment of the present invention.

FIG. 8 is a diagram illustrating a sixth embodiment of the present invention. A difference from FIG. 7 is that a global source line RS is provided, respectively. Accordingly, latch circuits of DLS and DLB are provided. Part of these circuits can be shared. In this manner, parasitic capacitance of each of the global bit line for read RGB, the global bit line for programming/erasing WGB, and the global source line RS can be reduced. Also, there is a feature in increasing freedom of design of the programming/erasing driver and a connection circuit for read.

Figure 9:
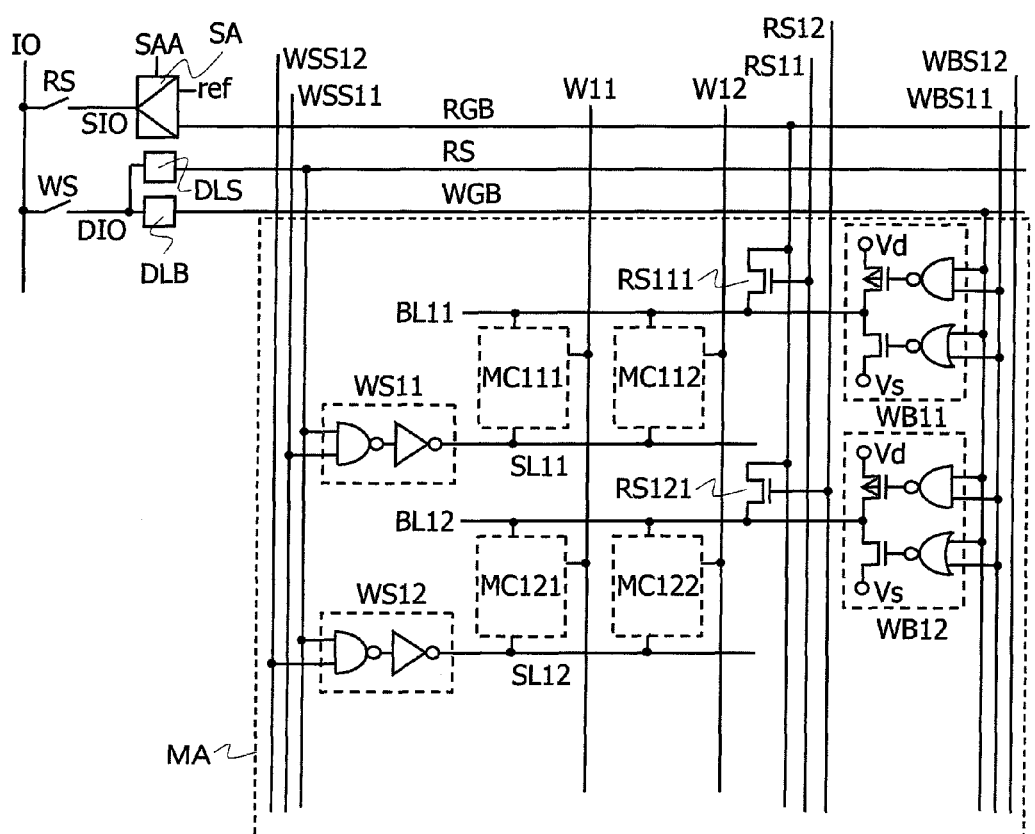
FIG. 9 is a diagram illustrating a seventh embodiment of the present invention.

FIG. 9 is a diagram illustrating a seventh embodiment of the present invention. This embodiment more specifically describes the programming/erasing circuit and read circuit in the example of FIG. 8. The circuits WB11 and WB12 which drive the local bit lines BL11 and BL12 are formed of an NAND circuit and a pMOS transistor driven by the NAND circuit and an NOR circuit and an nMOS transistor driven by the NOR circuit; and the pMOS transistor and nMOS transistor are connected between a high-voltage power supply Vd and a low-voltage power supply (or ground potential power supply) and connected to the local bit line like FIG. 9. Inputs of the circuits WB11 and WB12 are the global bit line for programming/erasing WGB and the select signal lines WBS11 and WBS12. The circuits WS11 and WS12 which drive the local source lines SL11 and SL12 are formed of an NAND circuit and an inverter circuit. Inputs of the circuits WS11 and WS12 are the global source line RS and the select signal lines WSS11 and WSS12. Each of the connection circuits for read is formed of one nMOS transistor, and has a gate driven by the select signal lines RS11 and RS12, and the global bit line for read RGB is electrically connected to each of the local bit lines BL11 and BL12 by this signal. Note that; although it is eliminated in FIG. 9, other sets of local bit lines and local source lines connected to the global bit line and controlled by WBS11, WBS21, and RS21 in the same manner as FIGS. 6 and 8 are provided. According to such an example, a programming/erasing circuit and a connection circuit for read can be specifically configured.

Figure 10:
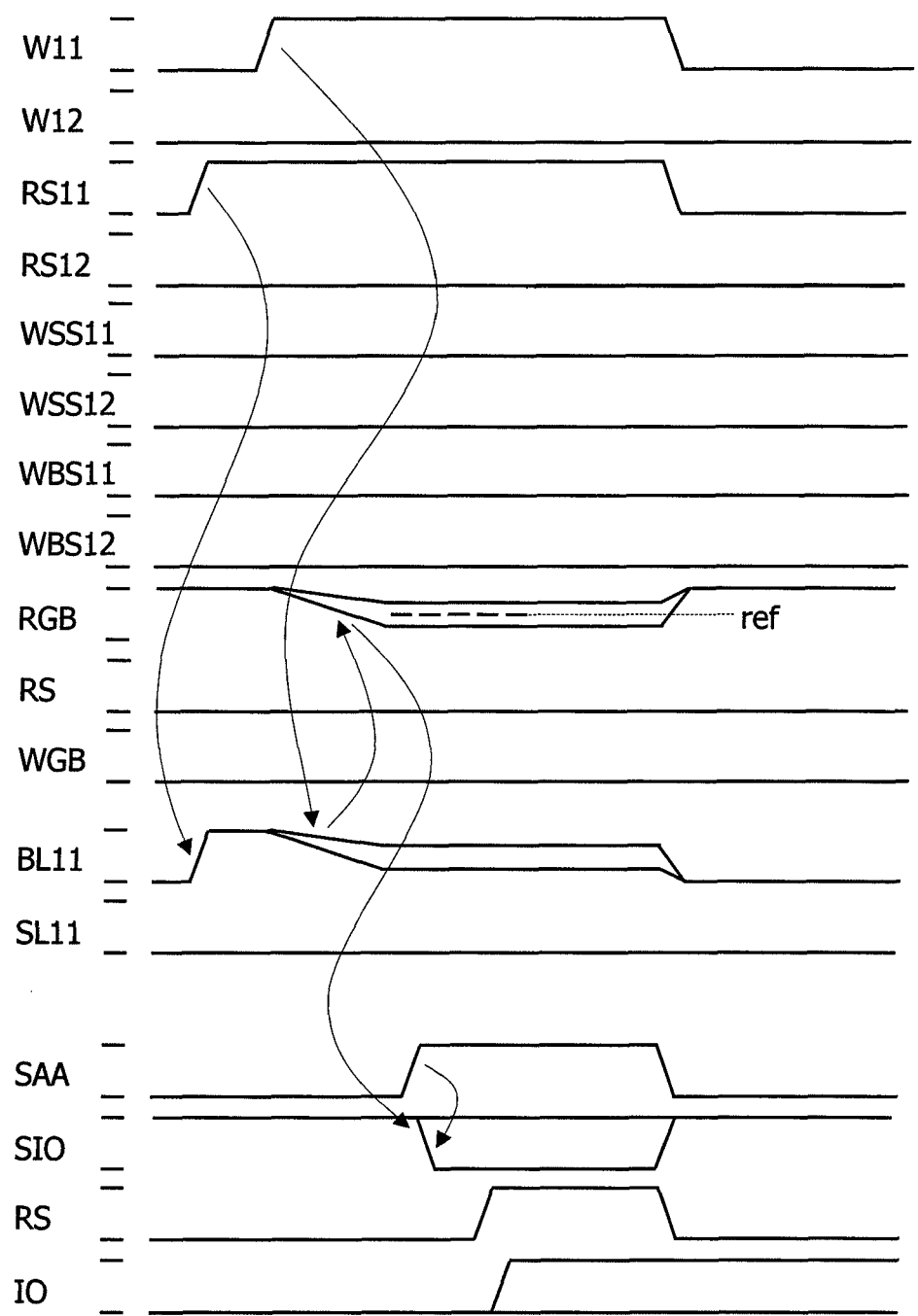
FIG. 10 is a diagram illustrating an example of read operation of a configuration example in FIG. 9.

FIG. 10 is a diagram illustrating an operation example upon read of the circuit in FIG. 9. A situation in which a memory cell MC111 connected to the local bit line BL11 and the local source line SL11 is selected will be described. First, the local bit line BL11 and the local source line SL11 are selected by RS11 and WS11. The BL11 is precharged via the global bit line for read RGB, and SL11 is grounded via WS11. Next, the word line W11 is activated, and the memory cell MC111 is selected. The word line W12 representing other memory cells remains unselected. In this manner, a signal corresponding to information of the memory cell selected by the bit line BL11 appears. This signal is transmitted to RGB. When the signal sufficiently appears and a difference between the reference voltage ref of the sense amplifier SA and each of the read signals becomes clear, SAA is selected and the sense amplifier SA is operated, and an amplified signal appears on SIO. Then, the Y select signal YS is activated, and a signal corresponding to IO is output. When a sequence of operation is ended, W11, RS11, SAA are back to unselected state again, and BL1, GB, SIO are also back to their initial states. YS is also becomes unselected state, and IO remains the same or be back to a constant potential by a following circuit while it is not illustrated in FIG. 9. In this manner, a read operation can be carried out by using the circuit of FIG. 9.

Figure 11:
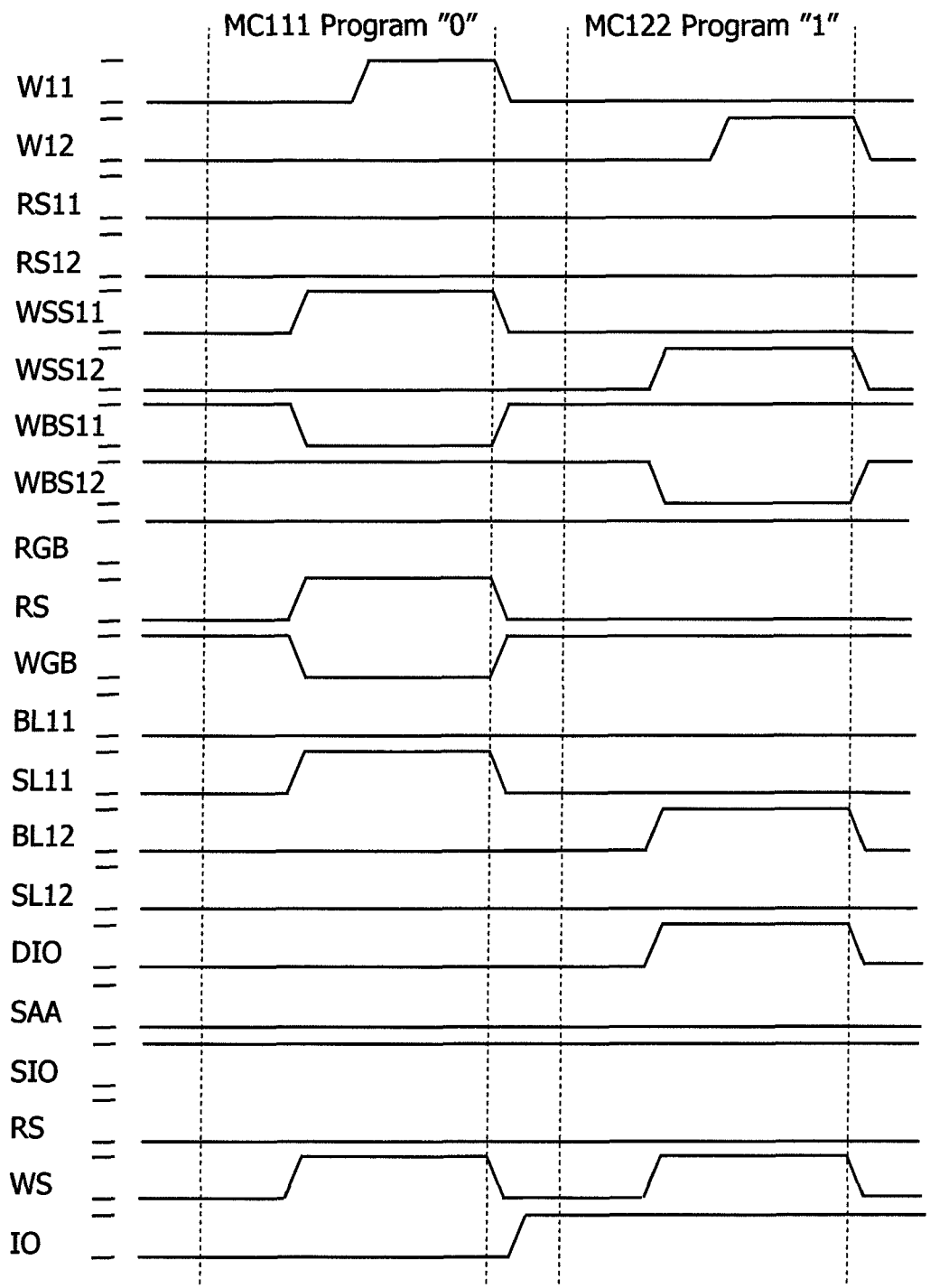
FIG. 11 is a diagram illustrating an example of programming operation of the configuration example in FIG. 9.

FIG. 11 is a diagram illustrating an operation example upon programming of the circuit in FIG. 9. Here, an operation in which "0" is first programmed in the MC111, and next "1" is programmed in MC122 will be described. First, WS is selected; data of IO at this moment is retrieved into DIO and retained in latch circuits DLS and DLB and then transmitted to RS and WGB; and a signal corresponding to information to be programmed to the memory cell appears. Here, when WSS11 and WBS11 are selected, according to this RS and WGB, information to be programmed to the memory cell MC111 appears on BL11 and SL11. In FIG. 11, corresponding to "0", WGB becomes a low level and RS becomes high level, and according to this, BL11 becomes a low level and SL11 becomes a high level. When W11 is selected in this state, programming to MC111 is started. Current is flowed from SL11 to BL11 via MC111. By this current, spin injection, which corresponds to a direction of the current, is performed inside the memory cell, thereby programming/erasing the memory cell to a corresponding state. When it ends, W11, WSS11, and WBS11 are in an unselected state, and supplement of current to the memory cell is stopped. Next, the operation is shifted to a programming operation of "1" to MC122. Here, YS is selected so that data of IO is retrieved to DIO and a potential corresponding to programming of "1" appears on RS and WGB. Here, when WSS12 and WBS12 are selected, BL12 is at a high level and SL12 is at a low level. When W12 is selected in this state, programming to MC122 is started. Current of this programming is in an opposite direction to the programming to MC111. Spin injection corresponding to the direction of the current is performed inside the memory cell, thereby programming/erasing the memory cell to a corresponding state. As compared to the situation of selecting WSS11 and WBS11 for programming "0", it is programming of "1" and thus the potential of WSS12 and WBS12 is opposite. As described in the foregoing, by using the circuit of FIG. 1, programming/erasing of memory cell can be performed.

Figure 12:
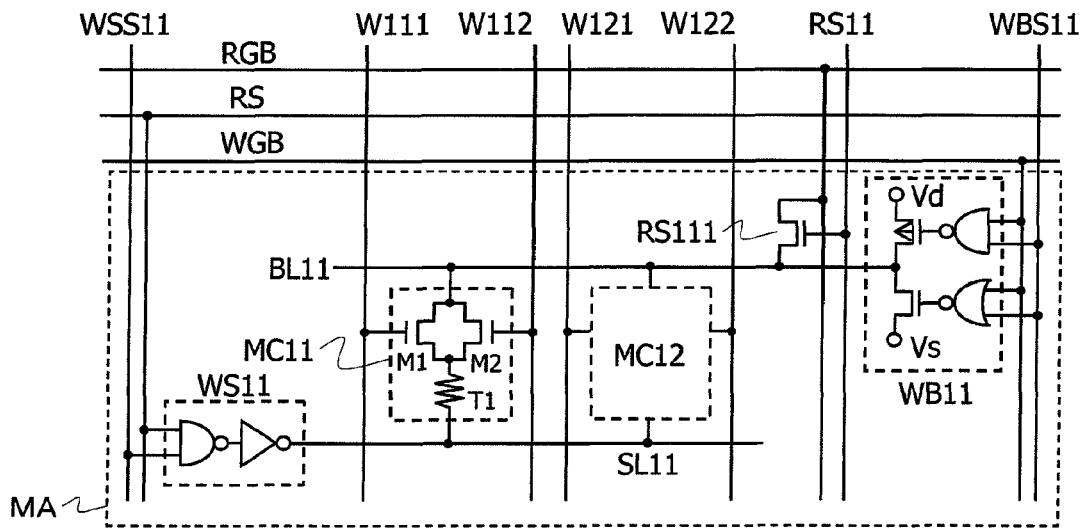
FIG. 12 is a diagram illustrating another configuration example of a memory cell used in the present invention.
Figure 13:
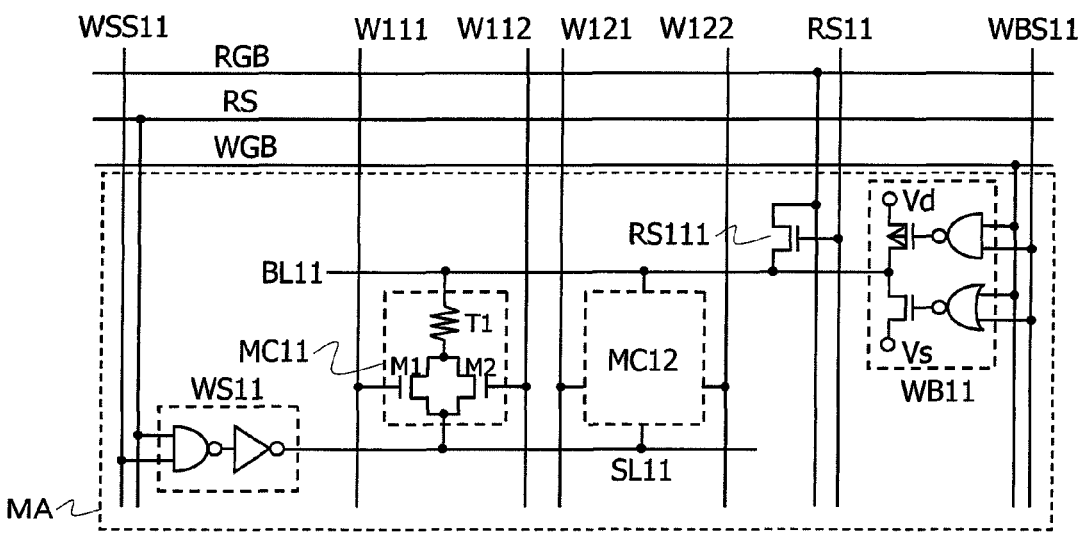
FIG. 13 is a diagram illustrating still another configuration example of a memory cell used in the present invention.

FIGS. 12 and 13 are diagrams illustrating another configuration example of the memory cell used in the foregoing embodiments in a part of the embodiment of FIG. 9. More specifically, in the foregoing embodiments, the memory cell has been configured with one select transistor and one TMR element. In the present embodiment, different from that, a memory cell is configured with two select transistors M1 and M2 and one TMR element T1. The two select transistors M1 and M2 are controlled by word lines W111 and W112. A difference between FIGS. 12 and 13 is that the select transistor is directly connected to a local bit line or directly connected a local source line. There is a feature in using the present embodiment that larger current can be flowed in the TMR element. In addition, while two word lines, for example, W111 and W112 inputted to one cell are simultaneously driven, aside from this, for example, only W111 is first selected and then W112 is selected as it is with delay. In this manner, there also is a feature of reducing programming/erasing current. When configuring in this manner, spin is swung in the free layer in the TMR element by first weak current in only W111 and it is considered that the spin becomes prone to change its direction. Therefore, rather than flowing programming/erasing current at once, first making it easy for the spin to change with first weak current and then selecting also W112 to flow proper programming/erasing current can achieve smaller programming/erasing current.

Figure 14:
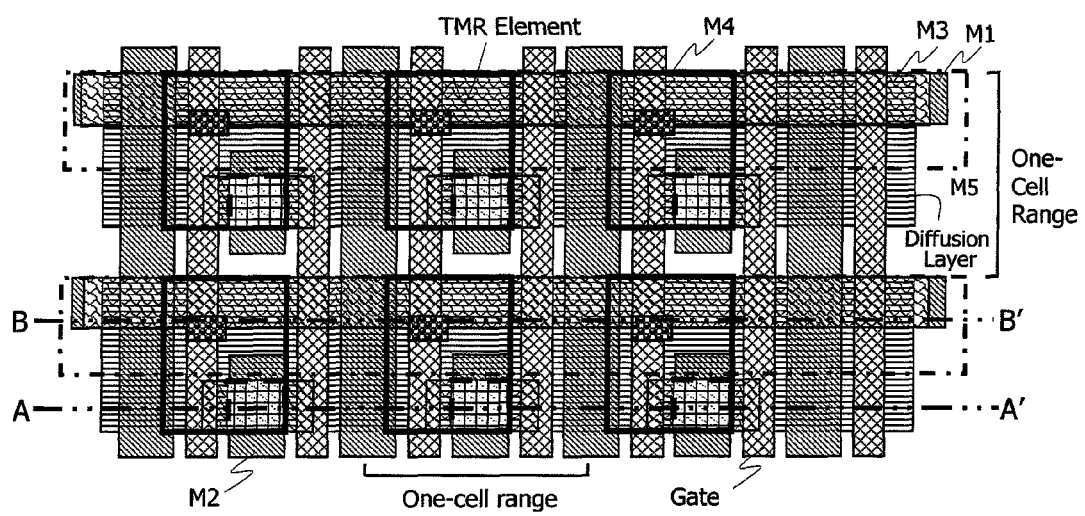
FIG. 14 is a diagram illustrating a layout of a memory cell array used in the present invention.
Figure 15:
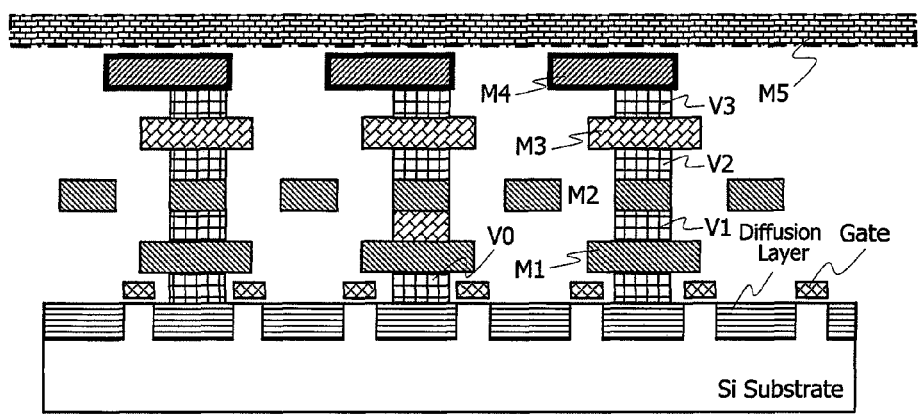
FIG. 15 is a cross-sectional view between A-A' in FIG. 14.
Figure 16:
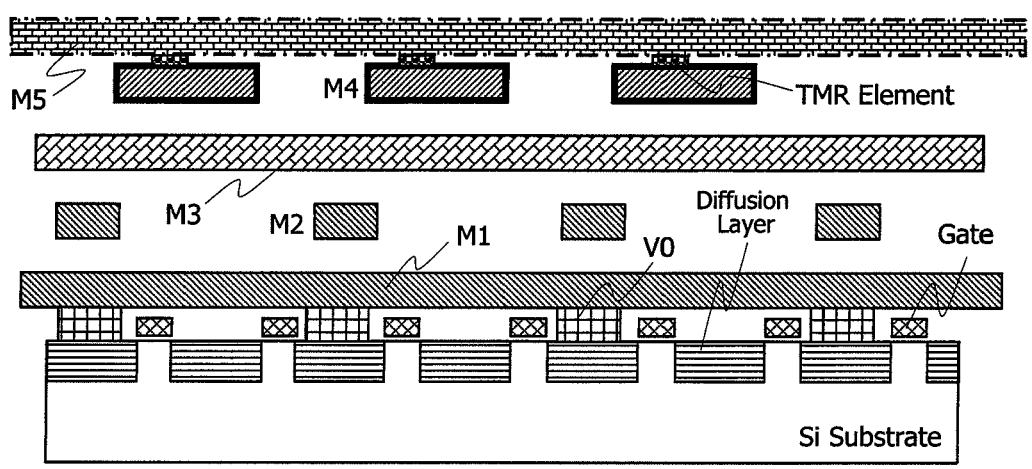
FIG. 16 is a cross-sectional view between B-B' in FIG. 14.

FIG. 14 is a layout example of a memory cell array used in the present invention. Also, a cross section of A-A' in FIG. 14 is illustrated in FIG. 15, and a cross section of B-B' in FIG. 14 is illustrated in FIG. 16. One memory cell is formed of two lines of gates and one TMR element, and thus, it is the memory cell illustrated in FIG. 12 in view of circuit diagram. The gates are word lines, and its material is P-type polysilicon or, although not illustrated, silicide or tungsten (W) is stacked on P-type polysilicon to lower resistance. In addition, a diffusion layer is isolated only by the gates, and thus adjacent cells are used being the fact that they are electrically insulated when a gate voltage is 0 V. In this manner, with using two transistors per memory cell, a small layout area can be achieved. M1 to M5 are metal wirings, V1 to V3 are connection layers between wiring layers, and V0 is a connection layer between a metal layer M1 and the diffusion layer or gate. The TMR element is disposed between M4 and M5 as an example, in which the TMR element is arranged at a position shifted from the connection layer V3 between the wiring layers. M1 is used as a local source line and a local bit line, M2 is used for lowering resistance than connecting polysilicon word lines at constant interval, and M3 is used as the global bit line (it may be for programming, reading, or sharing) or the global source line described in the foregoing. The local bit line orthogonally crosses the word line and wired to be parallel to the local source line.

Figure 17:
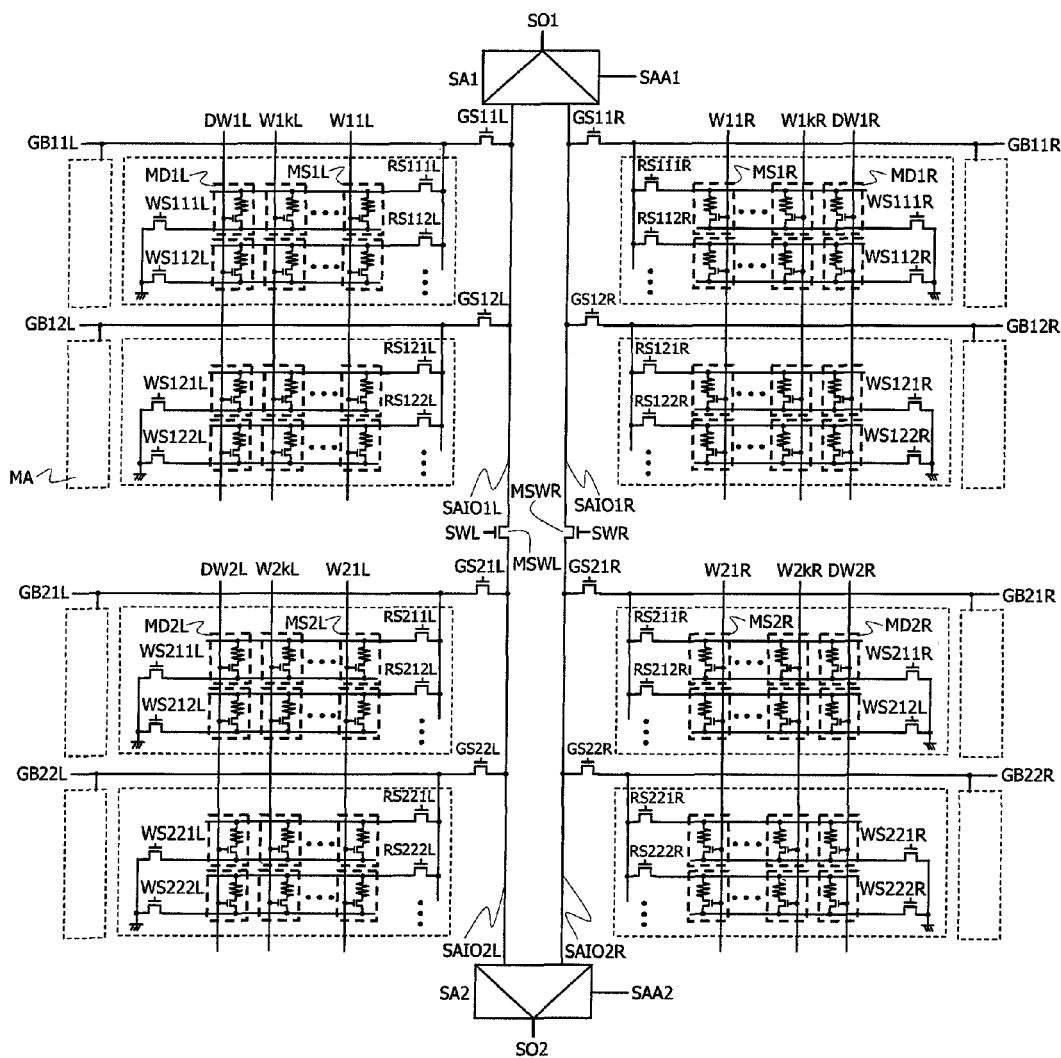
FIG. 17 is a diagram illustrating an eighth embodiment of the present invention.

FIG. 17 illustrates a method of generating a reference voltage used in the sense amplifier SA. In the present embodiment, the array configuration in which one sense amplifier is shared by a plurality of global bit lines as illustrated in FIG. 5 is described as an example. In addition, inside the memory array MA, a plurality of local bit lines and local source lines are connected to one global bit line illustrated in FIG. 6. Note that it is needless to say that the array configurations of other embodiments than those illustrated in FIGS. 5 and 6 can be used. Also, in the present embodiment, cells for reference are provided in the memory array MA, and each of the cells are connected to word lines DW1L and DW1R for reference.

Further, in the present embodiment, two sense amplifiers are disposed. One of the sense amplifiers SA1 has two inputs SAIO1L and SAIO1R, and memory cells are connected through a hierarchy described below, in which, when one of the sense amplifier is connected to a read cell, the other is connected to a reference cell. A hierarchical structure will be described exemplifying SAIO1L. There are global bit lines GB11L and GB12L, and MOS transistors GS11L and GS12L selectively connect the global bit lines and SAIO1L. To the global bit line GB11L, a plurality of local bit lines and source lines are connected by RS111L, RS112L, WS111L and WS112L. Note that, in the figure, global bit lines and global source lines related to a programming/erasing circuit and programming/erasing are omitted, and only a state upon read is schematically illustrated. W11L to W1$k$L are word lines, and information of memory cells (e.g., MS1L) connected to the word lines are read. DW1L is a reference word line, and a reference memory cell (e.g., MD1L) connected to the reference word line stores "1" or "0" which is reference information. The same configuration is provided on SAIO1R side.

In the present embodiment, when one of the SAIO1L side memory cell and the SAIO1R side memory cell is a reference cell, the other is selected to be a read cell. The same goes to SA2 having two inputs SAIO2L and SAIO2R, and connected to a memory cell by a hierarchical structure in the same manner as SA1. That is, the global bit lines are, for example, GB21L and GB22L etc., and W21L to W2$k$L are examples of word lines, DW2L is an example of the reference word line, MS2L is an example of the memory cell, and MD2L is an example of the reference memory cell. In the same manner as SA1, also in SA2, SAIO2L and SAIO2R are selected to be a reference cell and a read cell not to overlap to each other. Also, between SAIO1L and SAIO2L and between SAIO1R and SAIO2R, MOS transistors MSWL and MSWR capable of electrically connecting them are arranged, and control signals of the MOS transistors are SWL and SWR. Here, two inputs SAIO1L and SAIO2L connected by the MOS transistor MSWL are paired, and "0" is retained in a reference cell corresponding to one of the inputs, and "1" is stored in a reference cell corresponding to the other input. The same goes to MSWR side.

As an example for presenting a feature of the present embodiment, a situation in which a memory cell connected to SAIO1L and SAIO2L is selected to be original read cell, and a memory cell connected to SAIO1R and SAIO2R is selected to be a reference cell. More particularly, four cells in total are selected, one cell being selected corresponding to SAIO1L, SAIO2L, SAIO1R and SAIO2R. In the present embodiment, as described above, at this moment, "1" is programmed in one of the two reference cells, and "0" is programmed in the other. Each of the reference cells is connected to different sense amplifier SA1 or SA2. At this moment, the MOS transistor MSWR arranged between SAIO1R and SAIO2R to which the reference cells are connected is turned on to connect the two of the reference cells. Meanwhile, the MOS transistor between SAIO1L and SAIO2L to which the read cells are connected is not turned on, so that the two of the read cells are electrically separated.

In this manner, while it will be clear from operations and principle diagrams described later, there are features that current signals at a level intermediate between "1" and "0" can be generated in the sense amplifier on the side of SAIO1R and SAIO2R to which the reference cells are connected, and a temporal change of a signal when selecting a reference cell behaves in the same way as a temporal change of a signal of the original read cell. Thus, read can be performed stably. Also, as described later, as two reference cells of "1" and "0" are used, there is a feature that a temperature change of the reference cells can be close to a temperature change of actual read cells.

Figure 18:
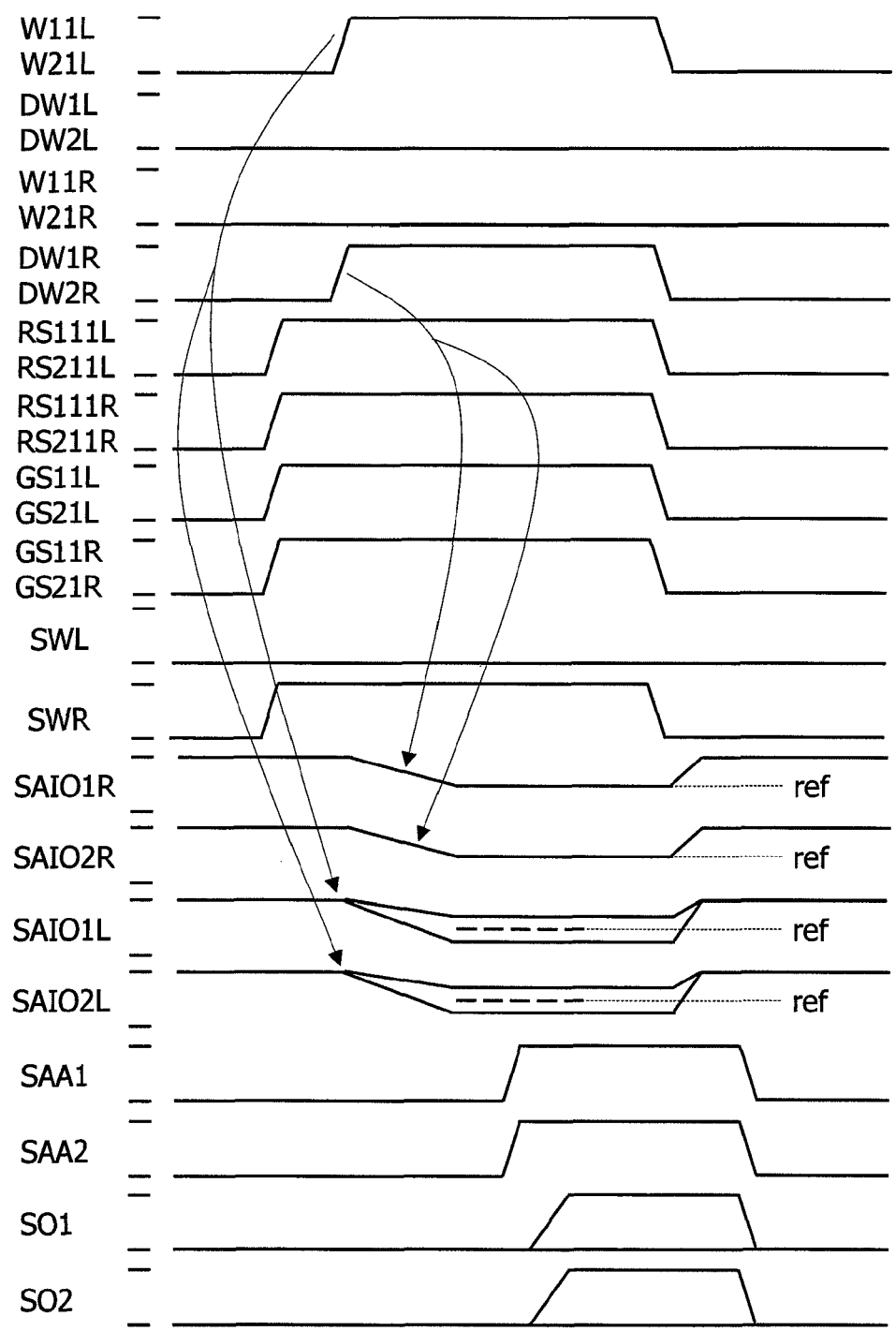
FIG. 18 is a diagram illustrating an example of a read operation of a configuration example in FIG. 17.

FIG. 18 is a diagram illustrating an operation example upon read of FIG. 17. The situation is such that the memory cells MS1L and MS2L are read and MD1R and MD2R are read as reference cells. "0" is programmed in one of MD1R and MD2R, and "1" is programmed in the other. First, a local bit line and a selected global bit lines are connected by RS111L, RS211L, R111R and RS211R, respectively, and, the global bit line GB11L is connected to SAIO1L, and the global bit line GB21L is connected to SAIO2L by signals of GS11L, GS21L, GS11R and GS21R. In addition, the above-described signal SWR for connecting SAIO1R and SAIO2R is selected. After this, the word lines W11L and W21L for selecting memory cells and the word lines DW1R and DW2R for selecting reference cells are selected. In this manner, memory cells and reference cells are read. Here, as SAIO1R and SAIO2R are connected, a current corresponding to a signal of "1" and a current corresponding to a signal of "0" are flowed. On the contrary, as there are two sense amplifiers of SA1 and SA2, an equivalent resistance here looks like a half of a resistance when there is only one sense amplifier. Thus, equivalently, a voltage signal corresponding to a half of a sum of a current corresponding to a signal of "1" and a current corresponding to a signal of "0" appears on SAIO1R and SAIO2R, and the voltage signal is taken as the reference signal ref for read. On the contrary, while a current corresponding to information of a memory cell to be read is flowed in SAIO1L and SAIO2L to which the read memory cell is connected, the sense amplifiers are individually connected one by one, and thus a voltage signal corresponding to a product of the equivalent resistance and each current value appears. In this manner, the sense amplifiers can read information of memory cells, and the signal is amplified by activation signals SAA1 and SAA2. Accordingly, correct results of read can be obtained on SO1 and SO2.

Effects of the embodiment in FIGS. 17 and 18 will be described with reference to FIGS. 19A to 21. A schematic drawing of the configuration of FIG. 17 is like FIG. 19A. There is an array having two sense amplifiers SA, and differential input terminals IO (corresponding to SAIO1L etc. in FIG. 17) of each sense amplifier have one input on reading side of the reference cell being short-circuited by two sense amplifiers, and the other input being independent. As another aspect, a configuration using reference cells in which two of "1" and "0" are programmed using one sense amplifier is illustrated in FIG. 19B. Here, at differential input terminals of one sense amplifier, a read signal is inputted to one of them, and two reference cells are inputted the other at the same time. At this time, as there are two memory cells at the reference cell side, a load resistance inside the sense amplifier is reduced to half. Also in the present embodiment, a signal at a level intermediate between "1" and "0" can be obtained on the reference side. An equivalent resistance here is illustrated in FIG. 20. Among the names put under the symbols of resistor, each of "1" and "0" denotes an equivalent resistance of reference cell to which a signal of itself is programmed, BL denotes an equivalent resistance of the local and global bit lines, IO denotes an equivalent resistance of wirings corresponding to SAIO1L etc. in FIG. 17, SA denotes a load resistance inside sense amplifiers, and CEL denotes a resistance of a memory cell to be read, which may corresponds to "1" or "0". D11 and D11' denote output voltages of load resistances inside the sense amplifiers, and a difference of them is amplified in the sense amplifier. In the present embodiment, two bit lines and memory cells are connected on the reference cell side. Also, to generate an intermediate potential from the two memory cells to which "1" and "0" are programmed, respectively, it is necessary to half the load resistance of the sense amplifier. In FIG. 20, this is denoted by ½. Therefore, the present embodiment has a feature that read can be performed with one sense amplifier but the resistance meshes and parasitic capacitances accompanied to that are asymmetric on the reference side and read side.

Figure 19A:
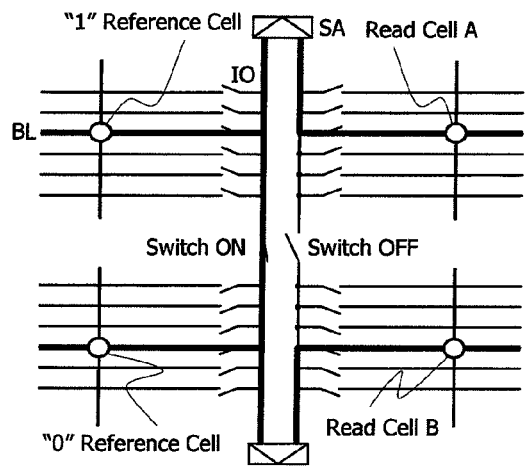
FIG. 19A is a diagram illustrating an example of an effect of the embodiment in FIGS. 17 and 18.
Figure 19B:
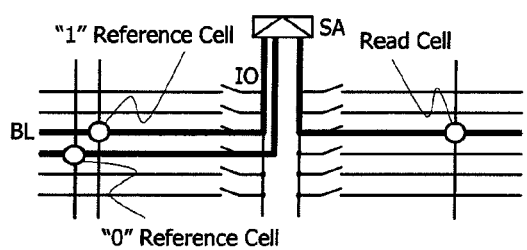
FIG. 19B is a diagram illustrating an example of an effect of the embodiment in FIGS. 17 and 18.
Figure 20:
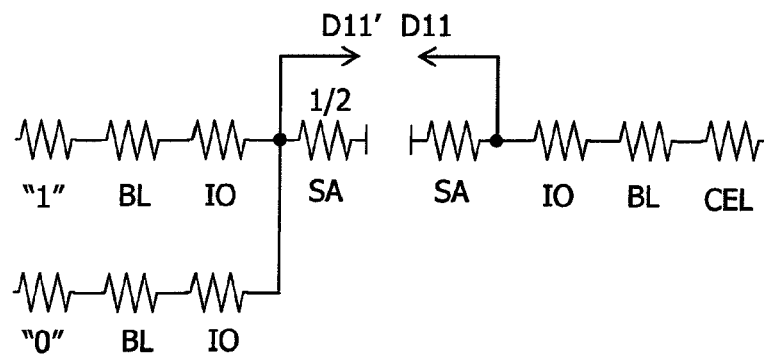
FIG. 20 is a diagram illustrating an example of an effect of the embodiment in FIGS. 17 and 18.
Figure 21:
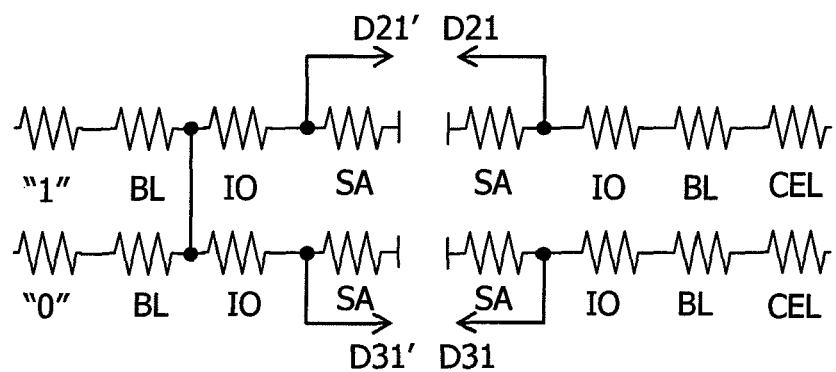
FIG. 21 is a diagram illustrating an example of an effect of the embodiment in FIGS. 17 and 18.

An equivalent resistance of the embodiment in FIG. 19A is illustrated in FIG. 21. D22, D22', D33 and D33' are output voltages of load resistors inside the two sense amplifiers and a difference between them is amplified in the sense amplifiers. In this configuration, shapes of resistance meshes on the read side and reference side can be the same and thus parasitic capacitances are equal. In addition, as terminals of the two sense amplifiers are short-circuited, the load resistances inside the sense amplifiers can be equivalently regarded as ½ of the load resistance, so that an intermediate potential can be generated from memory cells to which required "1" and "0" are programmed. Therefore, a time constant having equal temporal changes of D22 and D22' and D33 and D33' in operation can be obtained, and thus there is a feature of stable operation.

As described in the foregoing, two sense amplifiers SA1 and SA2 are paired, and "1" is stored in a reference cell of a memory array corresponding to one of the sense amplifiers and "0" is stored in a reference cell of a memory array corresponding to the other sense amplifier, so that an intermediate potential at good accuracy can be generated by short-circuiting inputs of the two sense amplifiers SA1 and SA2 when the reference cell is selected. Note that, effects of the present embodiment are particularly attained when the programming/erasing drivers described in the first to seventh embodiments are dispersedly arranged per memory array and also a global bit line is shared by a plurality of memory arrays and one sense amplifier is provided to the global bit line. This is because, when the configurations as the first to seventh embodiments are used, the current path to the sense amplifier gets long, and variations in load resistances and parasitic capacitances become large in accordance with the variations. However, it would be easily understood that the invention of the present embodiment is not limited to the array configurations as described in the first to seventh embodiments and the effects can be sufficiently achieved even in other array configurations.

Figure 22:
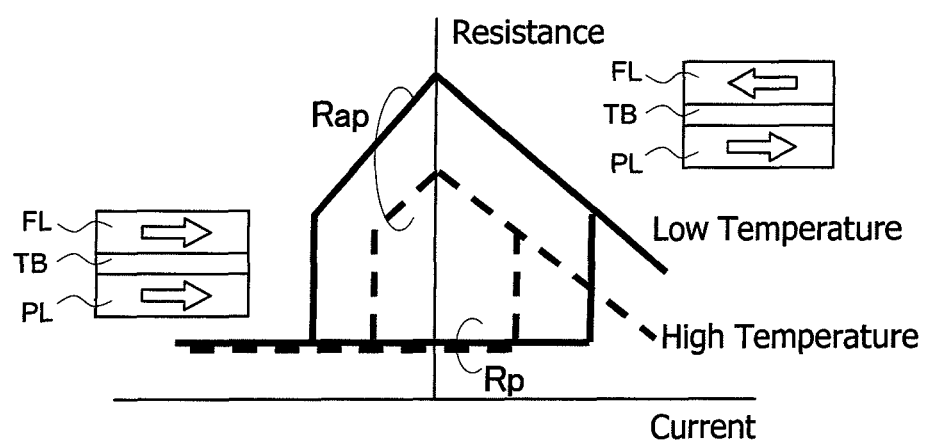
FIG. 22 is a diagram illustrating an example of temperature characteristics of a TMR element.
Figure 23:
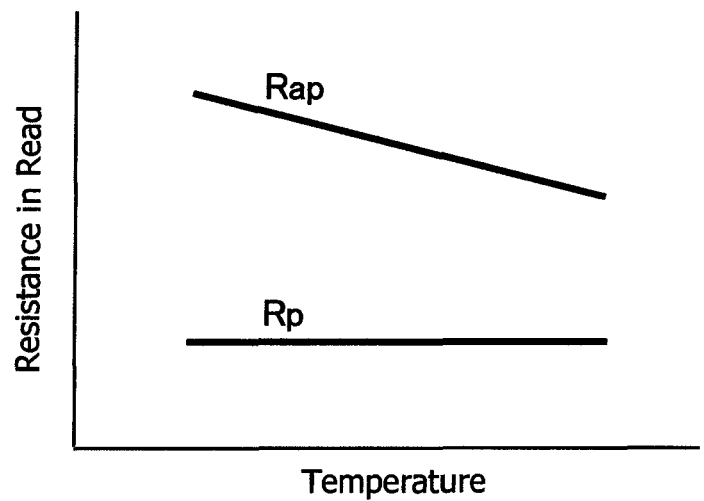
FIG. 23 is a diagram illustrating an example of temperature characteristics of a TMR element.

Temperature characteristics of a TMR element are illustrated in FIG. 22. FIG. 22 illustrates a current to flow in the TMR element on a horizontal axis, and a resistance at the moment on a vertical axis. The solid line is for a low temperature and the dotted line is for a high temperature. If an initial state is a parallel state, the resistance is low at this moment and a value of the resistance is Rp. When increasing a current toward the right direction in FIG. 22, the state of the TMR element is changed to an anti-parallel state when an amount of the current in this direction exceeds a certain current value. In this state, the resistance is large at the value of Rap. After this state is obtained, then a current to be flowed is increased toward an opposite direction. Then, when an amount of the current in this direction becomes larger than a certain current value, the state of the TMR element is changed and gets back to the original parallel state. Information items of "1" and "0" are stored corresponding to Rap and Rp. However, characteristics of Rap and Rp differ depending on temperature. First, the resistance value Rap in the anti-parallel state which is a high-resistance state is large at a low temperature, while it is small at a high temperature. In addition, a magnitude of the current upon changing the state is also large at the low temperature and small at the high temperature in an absolute value in each direction. On the other hand, the resistance value Rp in the parallel state depends little on temperature. When plotting focusing on temperature on the horizontal axis and a resistance value of a current upon read on the vertical axis, it is like FIG. 23. While the value of Rap decreases along with temperature, the value of Rp changes little. Since the TMR element has this property which the inventors have found out, it is preferable to form the reference cell using both of the resistors. Thus, in the examples in FIGS. 17 to 21, two memory cells of "1" and "0" are used, that is, the configuration is formed such that two memory cells in the state of resistance of Rap and a state of resistance of Rp are used regardless of their correspondence relationship, and a sum of the currents flowed in the memory cells is used, and the sum is ½ in view of circuit. Therefore, according to the embodiment, a reference cell capable of stable read can be achieved even when the TMR element inside the memory cell exhibits such temperature characteristics.

Figure 24:
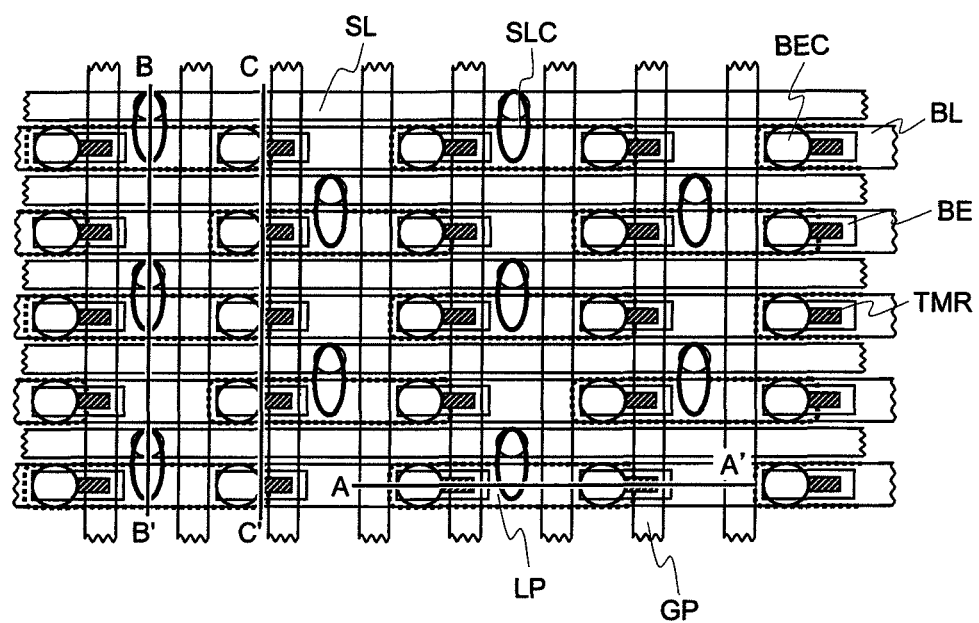
FIG. 24 is a diagram illustrating another layout example of a memory cell array for achieving the embodiments of the present invention.
Figure 25:
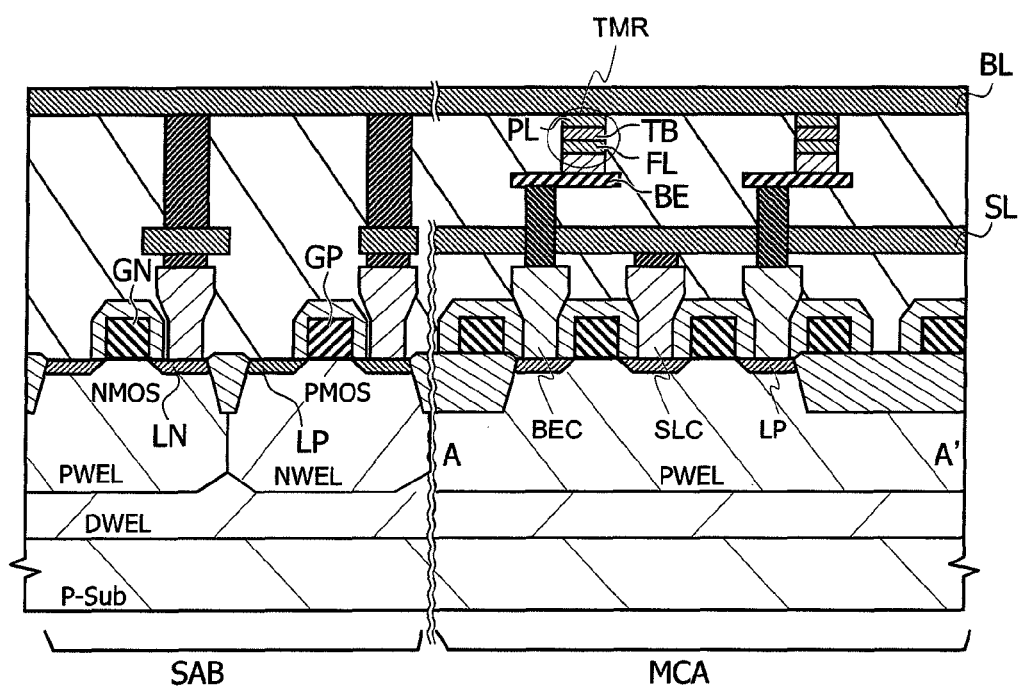
FIG. 25 is a cross-sectional view between A-A' and a cross-sectional view of a peripheral circuit in FIG. 24.
Figure 26:
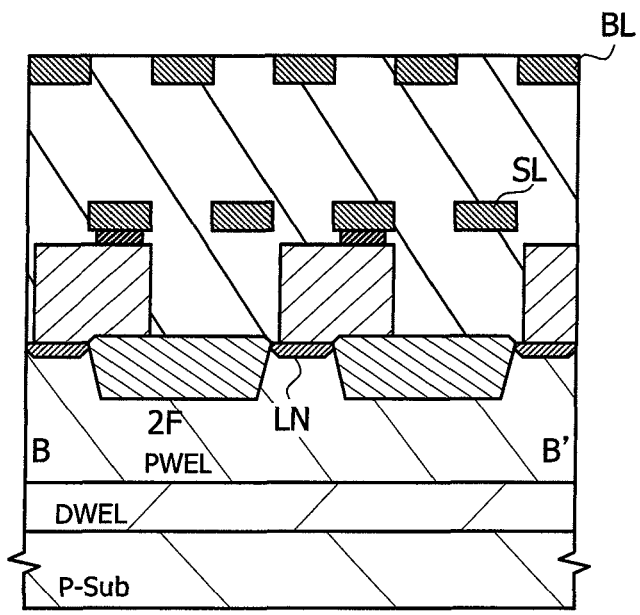
FIG. 26 is a cross-sectional view between B-B' and a cross-sectional view between C-C'.
Figure 26:
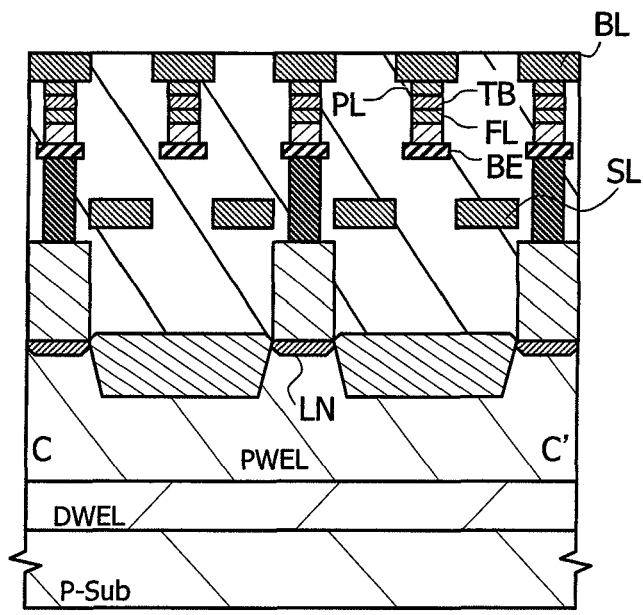

FIG. 24 illustrates another layout example of a memory cell array achieving the embodiments of the present invention. This embodiment is an aspect of arranging a local bit line and a source line under a global bit line. The upper global bit line is not illustrated. An area of a memory cell is $8F^2$ when a wiring pitch of the word lines or bit lines is 2F. Also, FIG. 25 illustrates a cross-sectional view between A-A' of FIG. 24 and a cross-sectional view of a peripheral circuit. FIG. 26 illustrates a cross-sectional view between B-B' and a cross-sectional view between C-C'. The memory cell is formed of one nMOS transistor and a magnetic tunnel junction TMR. A word line WL is connected to a gate GP of the transistor. A gate material is P-type polysilicon or silicide or tungsten (W) is stacked on P-type polysilicon to lower the resistance. A memory cell transistor is formed inside a p-type semiconductor region pWEL. The p-type semiconductor region pWEL is formed in an n-type semiconductor region DWEL, and this DWEL is formed on P-Sub. A source line contact SLC is disposed to one of diffusion layers LN of the nMOS transistor. The source line contact has a reduced area as being shared with adjacent memory cells. On the source line contact, a source line is wired in a direction perpendicular to the word line. To a diffusion layer LO to which the source contact is not disposed, a bottom electrode contact BEC connected to the magnetic tunnel junction TMR is disposed. The bottom electrode contact BEC is connected to a bottom electrode BE to which the magnetic tunnel junction is disposed. On the bottom electrode BE, the magnetic tunnel junction TMR formed of a plurality of magnetic film and tunneling films is disposed. The magnetic tunnel junction TMR includes at least one tunneling film TB and a fixed layer PL and a free layer FL disposed to two sides of the tunneling film TB. In the fixed layer PL of a magnetic material, a direction of spin of electrons inside is fixed to a fixed direction. Meanwhile, in the free layer FL of a magnetic material, a direction of spin of electrons inside is either of two states, parallel or anti parallel. In the present configuration, the fixed layer PL is arranged between the tunneling film TB and the bottom electrode, and the free layer FL is arranged between a bit line BL wired in an upper layer of the tunnel magnetoresistance TMR and the tunneling film TB. The bit line orthogonally crosses the word line, and wired in parallel to the source line. The magnetic tunnel junction TMR has a rectangular shape having a side in the wiring direction of the bit line longer than that in the wiring direction of the word line or an elliptic (oval) shape. In this manner, there is an advantage of improving retention property of the direction of spin of the free layer FL.

Figure 27:
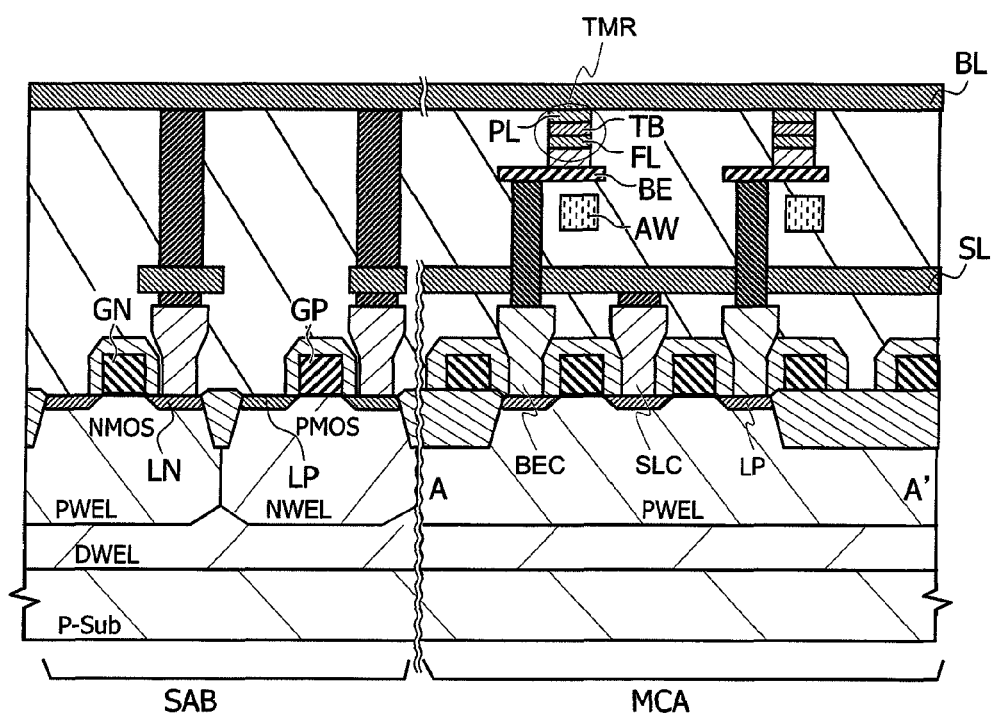
FIG. 27 is a diagram illustrating another layout example of a memory array achieving the embodiments of the present invention.

FIG. 27 is a layout example of a memory cell array illustrating another embodiment of the present invention. Only a part corresponding to FIG. 25 is illustrated. A feature of the present embodiment lies in that an assist word line AW running in parallel to the word line is disposed under the bottom electrode BE. By flowing a current in the assist word line AW, a magnetic field can be generated, and operation of the TMR element can be influenced.

Figure 28:
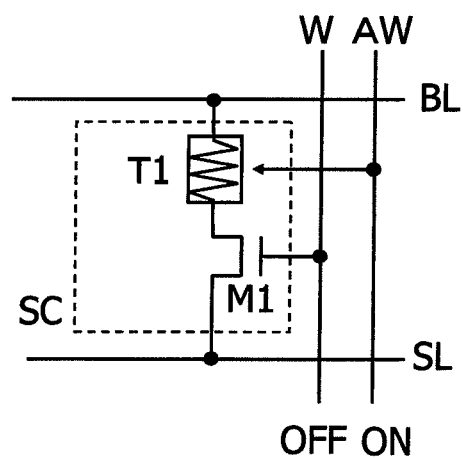
FIG. 28(1) is a circuit diagram corresponding to the memory cell in the cross-sectional structure of FIG. 27.
Figure 28:
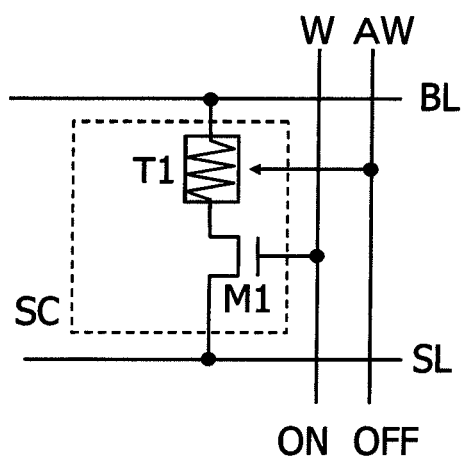

FIGS. 28(1) and 28(2) are drawn as circuit diagrams corresponding to a memory cell having the cross-sectional structure of FIG. 27. The word line W and the assist word line AW are arranged in parallel, and an arrow indicates that the assist word line AW can influence to the TMR element by a magnetic field generated by a current flowed in the assist word line. As examples of operation, there are examples illustrated in FIGS. 28(1) and 28(2). That is, a current is first flowed by turning on only the assist word line as illustrated in FIG. 28(1). In this manner, a state in which a direction of spin inside T1 can be easily changed by an actually generated magnetic field can be obtained. In a subsequent operation of FIG. 28(2), the word line W is then turned on, so that a programming/erasing current is flowed. Since the spin is already prone to be inverted by the operation of the assist word line AW, programming/erasing can be performed with a smaller current. Note that, the state immediately gets back to the initial state when merely flowing a current in the assist word line while the spin is prone to be inverted.

Figure 29:
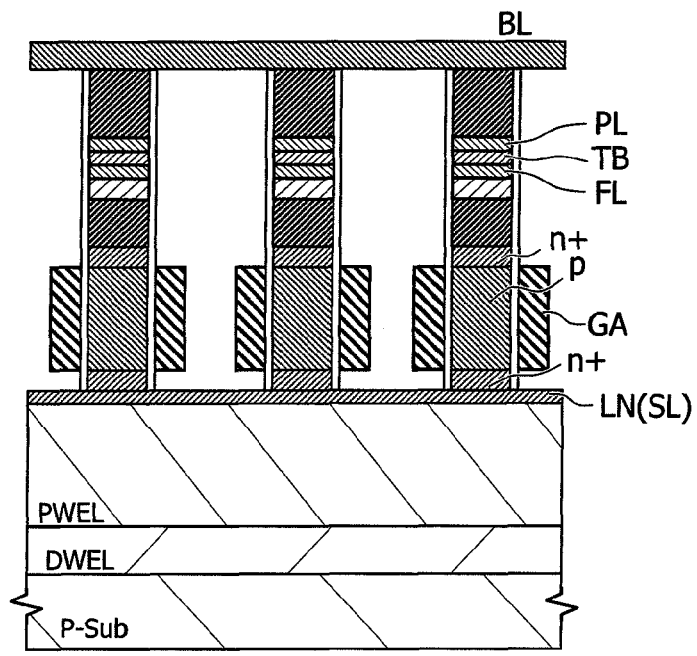
FIG. 29 is a diagram illustrating another layout example of a memory array achieving the embodiments of the present invention.
Figure 30:
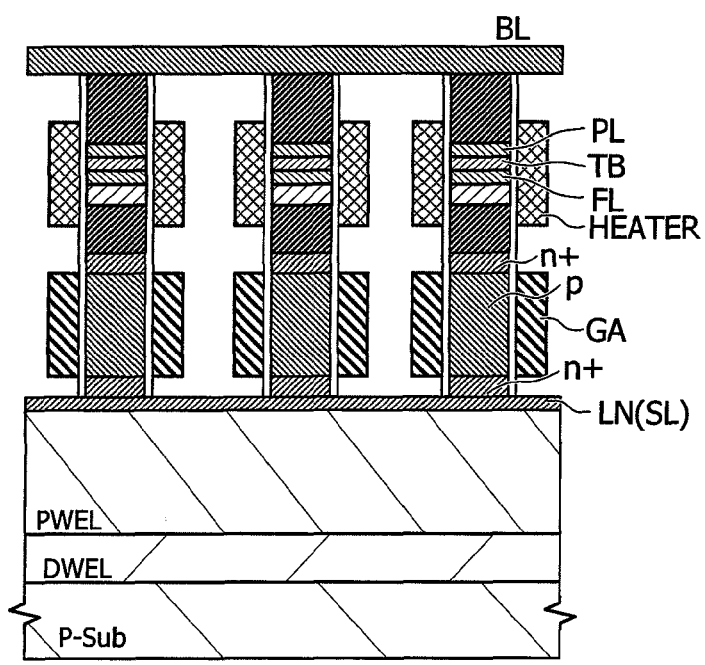
FIG. 30 is a diagram illustrating another layout example of a memory cell array achieving the embodiments of the present invention.
Figure 31:
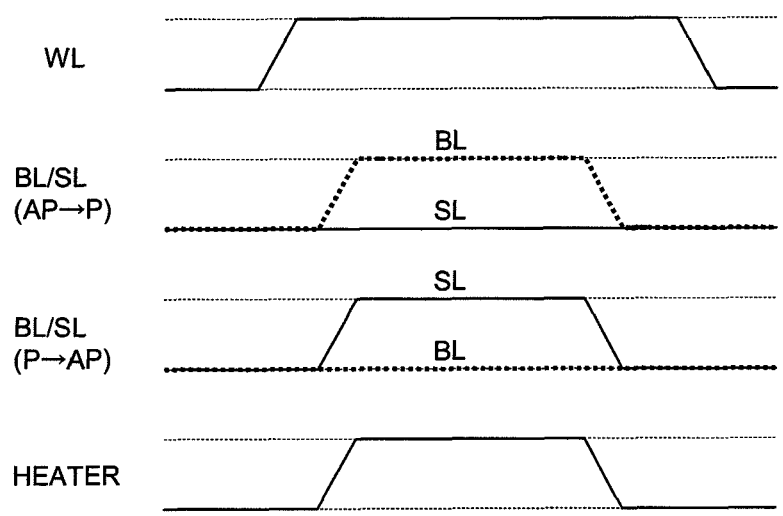
FIG. 31 is a diagram illustrating an operation example of a memory cell array in FIG. 30.

FIG. 29 is a diagram illustrating a cross-sectional structure of another memory cell array for achieving the present invention. A memory cell transistor is formed of a vertical MOS, and it can reduce a memory cell area to $4F^2$. PL denotes a fixed layer, FL denotes a free layer, and TB denotes a tunnel barrier, and they form a TMR element. While PL is put at an upper portion in FIG. 29, PL may be put at a lower portion. Also, the order of arranging them in a height direction of the vertical MOS may be different from FIG. 29. GA denotes a gate, n+ regions above and below GA are source and drain, and the operation is the same as a normal MOS by a voltage applied to the gate GA in a p-region. The gate GA may circularly surround the p-region or planes of the vertical structure may be controlled from two directions or three directions. In addition, as the vertical MOS, FIG. 29 illustrates an nMOS but the vertical MOS can be formed of a pMOS. FIG. 30 includes a heater element HEATER further added to the TMR element. This portion has a property of heating when a current or voltage is applied thereto, and it heats the TMR element by activating the element upon programming. As described in FIG. 22, a current necessary to program can be small at a high temperature. Therefore, there is a feature of enabling programming at low power. Operation is as described in FIG. 31 such that a signal is applied to HEATER when programming by spin injection by selecting a word line, bit line and source line to generate heat.

Figure 32A:
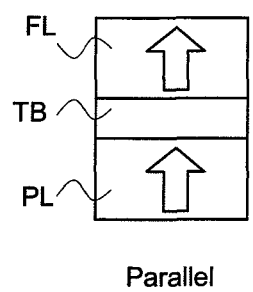
FIG. 32A is a diagram illustrating another configuration example of a magnetic tunnel junction element TMR.
Figure 32B:
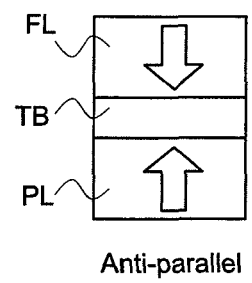
FIG. 32B is a diagram illustrating another configuration example of a magnetic tunnel junction element TMR.
Figure 35A:
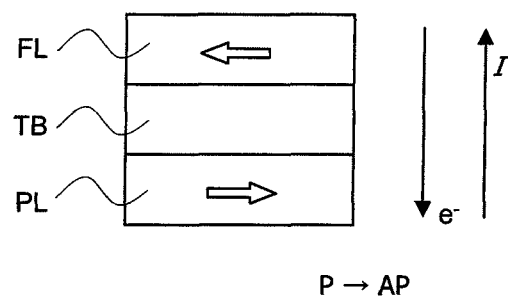
FIG. 35A is an explanatory diagram of control of directions of spin of a free layer by current.
Figure 35B:
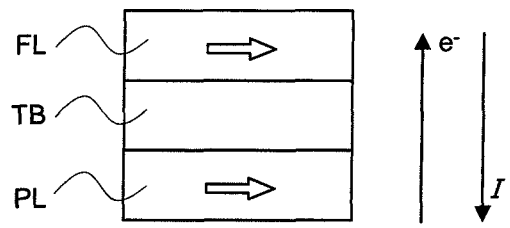
FIG. 35B is an explanatory diagram of control of directions of spin of a free layer by current.

FIG. 32 schematically illustrates a portion of a TMR element in another memory cell array achieving the present invention. In this embodiment, directions of magnetization of free layer and fixed layer are perpendicular to a tunnel barrier layer instead of horizontal different from FIG. 35. By selecting such a material, a memory element has two states (parallel and anti-parallel) of a TMR element being much stable to disturbance due to heat. An embodiment using the temperature control of the present invention and/or a method performing destructive read has a feature of achieving a memory operation stably operating in a wide temperature range even if scaling is promoted.

Figure 33A:
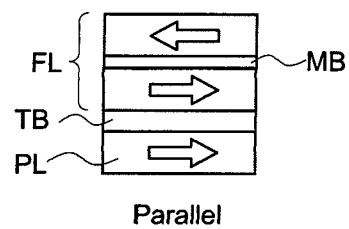
FIG. 33A is a diagram illustrating another configuration example of a magnetic tunnel junction element TMR.
Figure 33B:
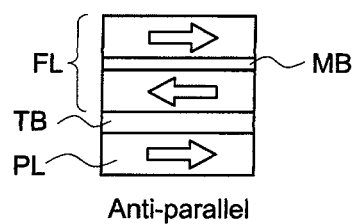
FIG. 33B is a diagram illustrating another configuration example of a magnetic tunnel junction element TMR.
Figure 34A:
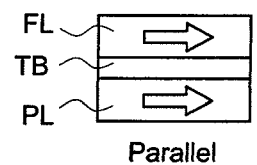
FIG. 34A is a diagram illustrating a configuration example of a magnetic tunnel junction element TMR.
Figure 34B:
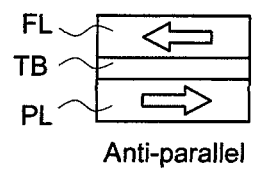
FIG. 34B is a diagram illustrating a configuration example of a magnetic tunnel junction element TMR.

FIG. 33 schematically illustrates a portion of a TMR element of another memory cell array achieving the present invention. Different from FIG. 35, a free layer has a stacked structure. More specifically, it is a structure in which a nonmagnetic layer MB is sandwiched between magnetic material layers which are both anti-parallel with each other, and they are integrated to be the free layer. This stacked structure may have more layers. According to such a structure, a memory element has a TMR element to be kept in stable state to disturbance due to heat.

INDUSTRIAL APPLICABILITY

The present invention relates to a semiconductor device and relates to a field of an embedded memory or a single memory achieving a stable programming/erasing operation a stable read operation in a wide temperature range in a memory array which is non-volatile and having a large number of programming/erasing cycles and a small area.

SYMBOLS

GB: Upper bit line and global bit line; BL1 and BL2: Lower bit line and local bit line; SL1 and SL2: Lower source line and local source line; WB1, WB2, WS1, WS2: programming/erasing driver; WSS1 and WSS2: Select signal line; SA/DL: Sense amplifier/programming/erasing latch; Activation signal: SAA; YS: Y select signal; IO: IO line; MC11, MC12, MC21 and MC22: Memory cell; M1: Select transistor; T1: TMR element; W11, W12, W21 and W22: Word line; SC, SC1, SC2 and MC: Memory cell; T1: Magnetic tunnel junction element; WE, WE1, WE1B, WE2, WEP and WED: Programming/erasing control signal; IO: Input/output line; Y1: Column select signal; LTP and LTA: Latch output; SL: Source line; SLC: Source line contact; BEC: Bottom electrode contact; BL: Bit line; BE: Bottom electrode; TMR: Magnetic tunnel junction element; GP: P-type polysilicon gate; LP: P-type diffusion layer; FL: Free layer; TB: Tunneling film; PL: Free layer; GN: n-type polysilicon gate; LN: n-type diffusion layer; PWEL: P-type semiconductor region; NWEL: N-type semiconductor region; and P-Sub: p-type substrate.

The invention claimed is:

1. A semiconductor device comprising:
    a first memory array including a plurality of first word lines, one of a plurality of first local bit lines wired in a direction crossing the plurality of first word lines, a plurality of first memory cells arranged at intersections of the plurality of first word lines and the first local bit line, and a first bit line driver connected to the first local bit line;
    a second memory array including a plurality of second word lines, one of a plurality of first local bit lines wired in a direction crossing the plurality of second word lines, a plurality of second memory cells arranged at intersections of the plurality of second word lines and the second local bit line, and a second bit driver connected to the second local bit line;
    a global bit line provided to be shared by the first local bit line and the second local bit line; and
    a sense amplifier connected to the global bit line,
    wherein information read from one of the plurality of first memory cells or one of the plurality of second memory cells is inputted to the sense amplifier through the global bit line,
    wherein when programming information to one of the plurality of first memory cells, the first bit line driver is activated and the second bit line driver is deactivated,
    wherein when programming information to one of the plurality of second memory cells, the second bit line driver is activated and the first bit line driver is deactivated,
    wherein the first bit line driver and the second bit line driver are each individually connected to a corresponding one of the first local bit lines and the second bit lines, respectively,
    wherein the first local bit line and the second local bit line are both connected to the sense amplifier via the global bit line in common.

2. The semiconductor device according to claim 1,
    wherein the first memory array further includes a first local source line wired in a direction crossing the plurality of first word lines, and a first source line driver connected to the first local source line,
    wherein the plurality of first memory cells are arranged between the first local bit line and the first local source line, and information to be programmed is changed in accordance with directions of a current flowing between the first local bit line and the first local source line,
    wherein the second memory cell array further includes a second local source line wired in a direction crossing the plurality of second word lines and a second source line driver connected to the second local source line, and
    wherein the plurality of second memory cells are arranged between the second local bit line and the second local source line, and information to be programmed is changed in accordance with directions of a current flowing between the second local bit line and the second local source line.

3. The semiconductor device according to claim 2,
    wherein the plurality of first memory cells are formed in a first region in a rectangular shape,
    wherein the first bit line driver is arranged along a first side of the first region,
    wherein the first source line driver is arranged along a second side opposing the first side of the first region,
    wherein the plurality of second memory cells are formed in a second region in a rectangular shape,
    wherein the second bit line driver is arranged along a side of the second region, and
    wherein the second source line driver is arranged along a second side of the second region.

4. The semiconductor device according to claim 1,
    wherein the first memory array further includes a first select switch connected between the global bit line and the first local bit line,
    wherein the second memory array further includes a second select switch connected between the global bit line and the second local bit line,
    wherein when one of the plurality of first word lines is selected, the first select switch is activated and the second select switch is deactivated, and
    wherein when one of the plurality of second word lines is selected, the second select switch is activated and the first select switch is deactivated.

5. The semiconductor device according to claim 4,
    wherein the first select switch includes a first MOS transistor having a source/drain path between the global bit line and the first local bit line, and
    wherein the second select switch includes a second MOS transistor between the global bit line and the second local bit line.

6. The semiconductor device according to claim 1,
    wherein the first bit line driver drives the first local bit line to a potential corresponding to information to be programmed when programming information to one of the plurality of first memory cells, and
    wherein the second bit line driver drives the second local bit line to a potential corresponding to information to be programmed when programming information to one of the plurality of second memory cells.

7. The semiconductor device according to claim 2,
    wherein the first bit line driver drives the first local bit line to a potential corresponding to information to be programmed when programming information to one of the plurality of first memory cells, wherein the first source line driver drives the first local source line to a first potential when reading information from one of the plurality of first memory cells, and drives the first local source line to a potential corresponding to information to be programmed when programming information to one of the plurality of first memory cells, wherein the second bit line driver drives the second local bit line to a potential corresponding to information to be programmed when programming information to one of the plurality of second memory cells, and wherein the second source line driver drives the second local source line to a potential corresponding to information to be programmed when programming information to one of the plurality of second memory cells.

8. The semiconductor device according to claim 1, wherein, when reading information from one of the plurality of first memory cells, the sense amplifier compares a potential generated by extracting charges retained in the global bit line and a reference voltage, and amplifies a difference in the potentials.

9. The semiconductor device according to claim 8, wherein the reference voltage is generated by simultaneously selecting a, first reference cell storing information of "0" and a second reference cell storing information of "1".

10. The semiconductor device according to claim 1, wherein the first memory array further includes a third local bit line crossing the plurality of first word lines, and a plurality of third memory cells provided at intersections of the plurality of first word lines and the third local bit line, wherein the first and third local bit lines are arranged next to each other in a direction in which the plurality of first word lines extend, wherein the second memory cell array further includes a fourth local bit line crossing the plurality of second, word lines, and a plurality of fourth memory cells provided at intersections of the plurality of second word lines and the fourth local bit line, wherein the second and fourth local bit lines are arranged next to each other in a direction in which the plurality of second word lines extend, and wherein the global bit line is connected to the first to fourth local bit lines.

* * * * *